US012765159B2

(12) United States Patent
Torimoto et al.

(10) Patent No.: US 12,765,159 B2
(45) Date of Patent: Oct. 13, 2026

(54) LIGHT EMITTING MATERIAL AND METHOD FOR MANUFACTURING SAME

(71) Applicants: NATIONAL UNIVERSITY CORPORATION TOKAI NATIONAL HIGHER EDUCATION AND RESEARCH SYSTEM, Nagoya (JP); OSAKA UNIVERSITY, Suita (JP); NICHIA CORPORATION, Anan (JP)

(72) Inventors: Tsukasa Torimoto, Nagoya (JP); Tatsuya Kameyama, Nagoya (JP); Susumu Kuwabata, Suita (JP); Taro Uematsu, Suita (JP); Daisuke Oyamatsu, Tokushima (JP)

(73) Assignees: NATIONAL UNIVERSITY CORPORATION TOKAI NATIONAL HIGHER EDUCATION AND RESEARCH SYSTEM, Nagoya (JP); OSAKA UNIVERSITY, Suita (JP); NICHIA CORPORATION, Anan (JP)

( * ) Notice: Subject to any disclaimer, the term of this patent is extended or adjusted under 35 U.S.C. 154(b) by 1045 days.

(21) Appl. No.: 17/905,938

(22) PCT Filed: Mar. 8, 2021

(86) PCT No.: PCT/JP2021/009050

§ 371 (c)(1),
(2) Date: Sep. 8, 2022

(87) PCT Pub. No.: WO2021/182412

PCT Pub. Date: Sep. 16, 2021

(65) Prior Publication Data

US 2023/0165026 A1 May 25, 2023

(30) Foreign Application Priority Data

Mar. 9, 2020 (JP) ................................ 2020-040093

(51) Int. Cl.
*C09K 11/58* (2006.01)
*B82Y 30/00* (2011.01)
(Continued)

(52) U.S. Cl.
CPC ............ *H10K 50/115* (2023.02); *B82Y 30/00* (2013.01); *B82Y 40/00* (2013.01); *C09K 11/56* (2013.01);
(Continued)

(58) Field of Classification Search
CPC ......... C09K 11/56; C09K 11/62; C09K 11/64; C09K 11/88; C09K 11/02; C09K 11/565;
(Continued)

(56) References Cited

U.S. PATENT DOCUMENTS

| | | | |
|---|---|---|---|
| 10,689,569 | B2 | 6/2020 | Wang et al. |
| 2010/0059743 | A1 | 3/2010 | Jun et al. |

(Continued)

FOREIGN PATENT DOCUMENTS

| | | | |
|---|---|---|---|
| CN | 103242831 | A | 8/2013 |
| JP | 2006335873 | A | 12/2006 |

(Continued)

OTHER PUBLICATIONS

Taniguchi, Y., et al., A Versatile Surface Design to Disperse Nanoparticles in Ionic Liquids and Organic Solvents, Chemistry Letters, (2016), vol. 45, pp. 898-900, 3 pages.

*Primary Examiner* — Matthew E. Hoban
*Assistant Examiner* — Lynne Edmondson
(74) *Attorney, Agent, or Firm* — Hunton Andrews Kurth LLP

(57) ABSTRACT

Provided is a luminescent material having excellent durability. The luminescent material contains second semicon-
(Continued)

ductor nanoparticles that contain first semiconductor nanoparticles and a deposit arranged on surfaces of the first semiconductor nanoparticles, and that emit light when irradiated with light; and a metal compound in which the second semiconductor nanoparticles are embedded. The first semiconductor nanoparticles contain $M^1$, $M^2$, and Z. $M^1$ is at least one selected from the group consisting of Ag, Cu, Au and alkali metals, and contains at least Ag. $M^2$ is at least one selected from the group consisting of Al, Ga, In and Tl, and contains at least one of In and Ga. Z contains at least one selected from the group consisting of S, Se, and Te. The deposit is substantially composed of at least one selected from the group consisting of Al, Ga, In, Tl and alkali metals, and at least one selected from the group consisting of S, O, Se, and Te. The metal compound contains at least one of Zn and Ga, and at least one of S and O.

12 Claims, 6 Drawing Sheets

(51) Int. Cl.

| | |
|---|---|
| ***B82Y 40/00*** | (2011.01) |
| ***C09K 11/08*** | (2006.01) |
| ***C09K 11/56*** | (2006.01) |
| ***C09K 11/62*** | (2006.01) |
| ***C09K 11/64*** | (2006.01) |
| ***C09K 11/88*** | (2006.01) |
| ***H10H 20/851*** | (2025.01) |
| ***H10K 50/115*** | (2023.01) |

(52) U.S. Cl.
CPC .............. *C09K 11/62* (2013.01); *C09K 11/64* (2013.01); *C09K 11/88* (2013.01); *H10H 20/8512* (2025.01)

(58) Field of Classification Search
CPC .. C09K 11/582; C09K 11/621; H10K 50/115; H10H 20/8512; H10H 20/8511; H10H 20/8514
See application file for complete search history.

(56) References Cited

U.S. PATENT DOCUMENTS

| | | | | |
|---|---|---|---|---|
| 2010/0084629 | A1 | 4/2010 | Kim et al. | |
| 2016/0137916 | A1* | 5/2016 | Wachi .................. | G02B 6/0065 252/519.31 |
| 2017/0012180 | A1 | 1/2017 | Baesjou et al. | |
| 2017/0029693 | A1 | 2/2017 | Gruhlke et al. | |
| 2017/0358745 | A1 | 12/2017 | Juang et al. | |
| 2018/0148637 | A1 | 5/2018 | Banin et al. | |
| 2019/0031952 | A1 | 1/2019 | Werner et al. | |
| 2019/0345384 | A1 | 11/2019 | Torimoto et al. | |
| 2020/0006601 | A1 | 1/2020 | Torimoto et al. | |
| 2021/0083146 | A1 | 3/2021 | Kuwabata et al. | |

FOREIGN PATENT DOCUMENTS

| | | | |
|---|---|---|---|
| JP | 2010090356 | A | 4/2010 |
| JP | 2017505842 | A | 2/2017 |
| JP | 2017506680 | A | 3/2017 |
| JP | 2017222851 | A | 12/2017 |
| JP | 2018039971 | A | 3/2018 |
| JP | 2018044142 | A | 3/2018 |
| JP | 2018510241 | A | 4/2018 |
| JP | 2018141141 | A | 9/2018 |
| JP | 2018527594 | A | 9/2018 |
| JP | 2019215516 | A | 12/2019 |
| WO | 2008013780 | A2 | 1/2008 |
| WO | 2013041864 | A1 | 3/2013 |
| WO | 2014208456 | A1 | 12/2014 |
| WO | 2018159699 | A1 | 9/2018 |
| WO | 2019160094 | A1 | 8/2019 |

* cited by examiner

[FIG. 1]
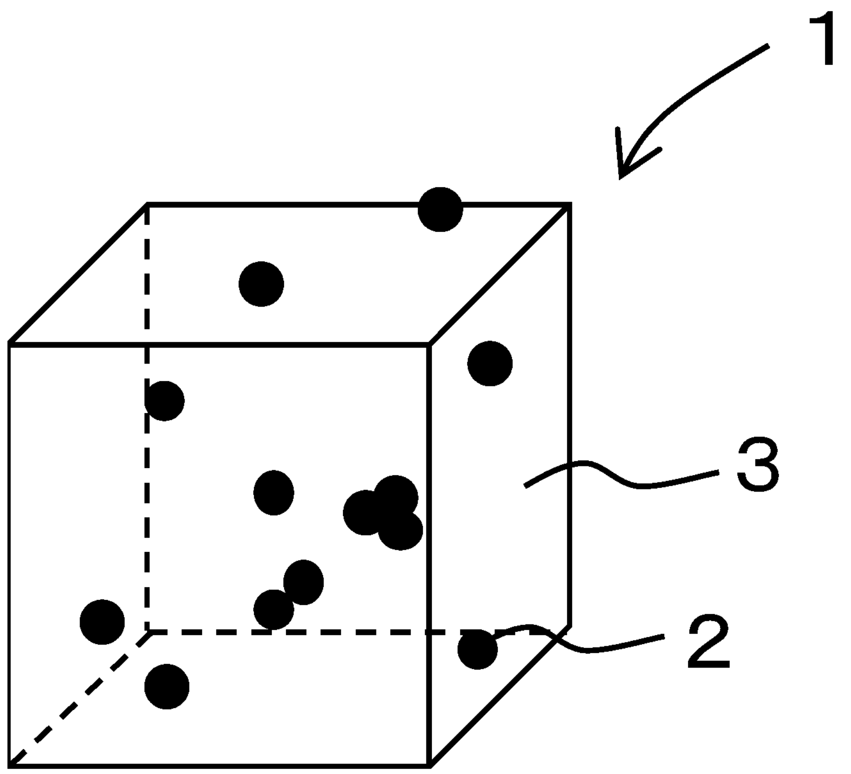

[FIG. 2]
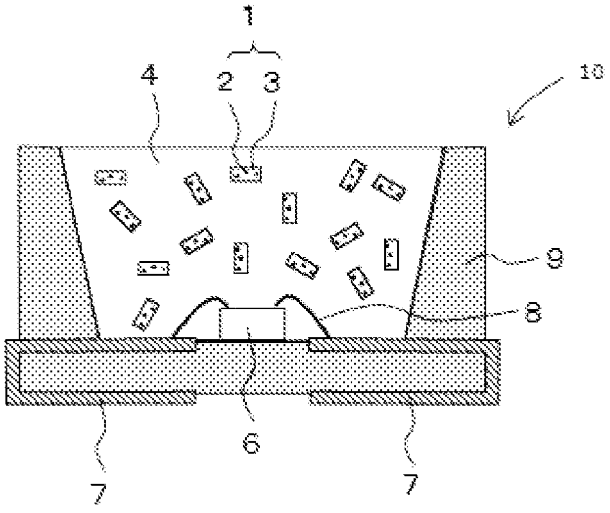

[FIG. 3]
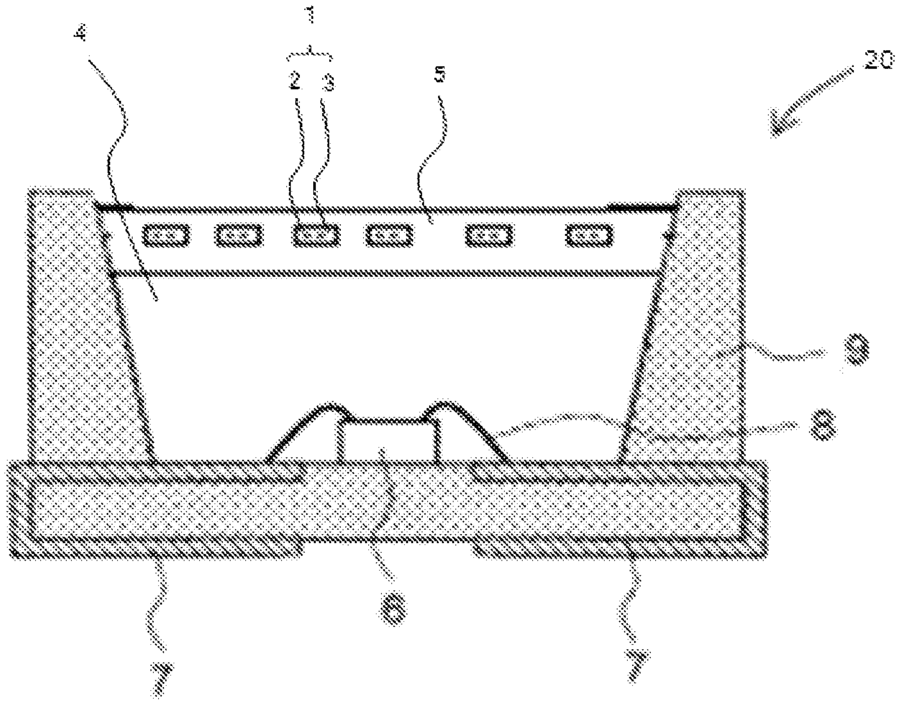

[FIG. 4]
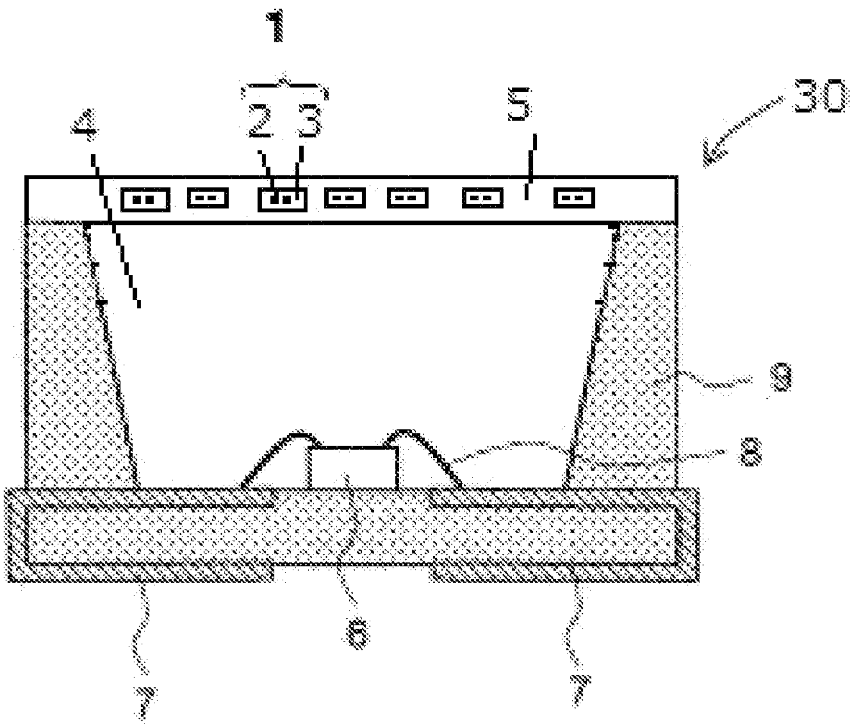

[FIG. 5]
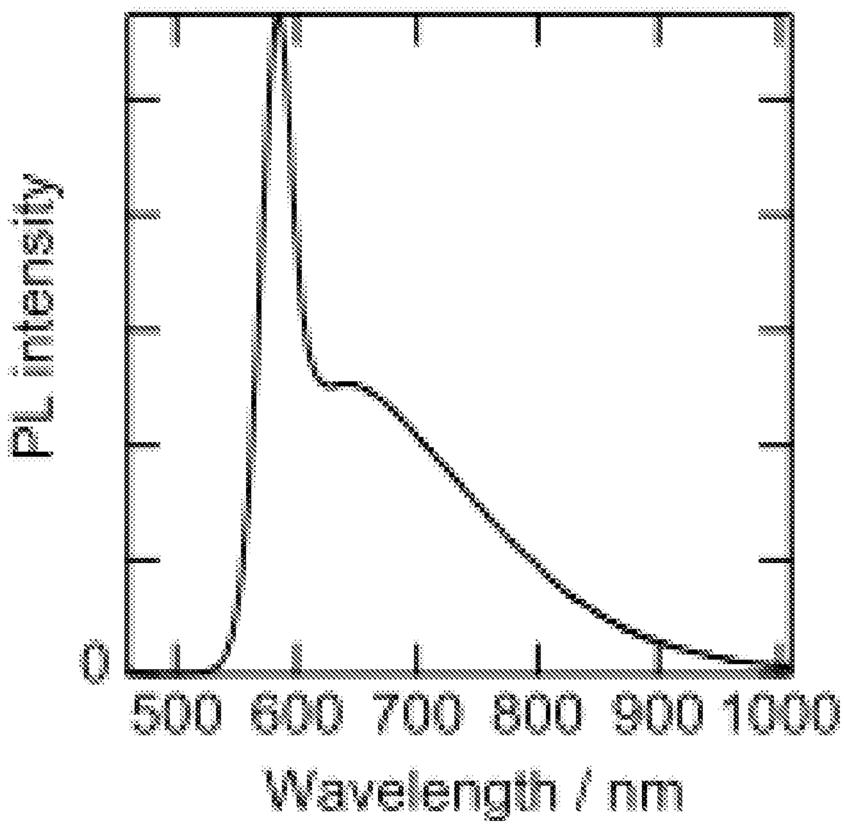

[FIG. 6]
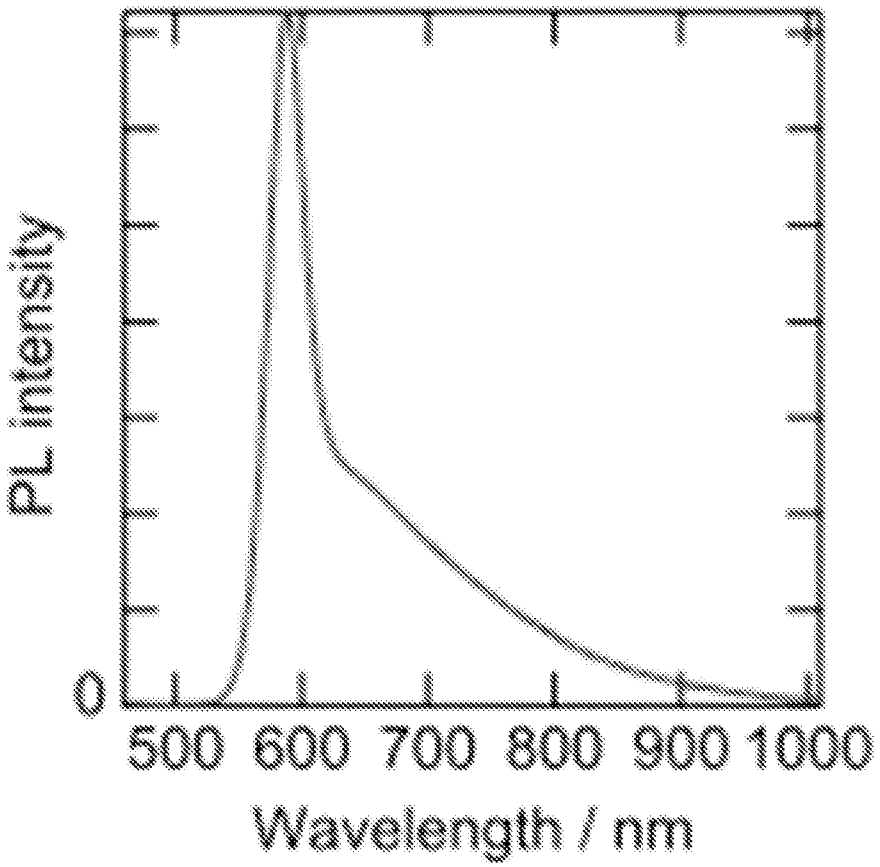

LIGHT EMITTING MATERIAL AND METHOD FOR MANUFACTURING SAME

CROSS-REFERENCE TO RELATED APPLICATIONS

This is a national phase application based on International Patent Application No. PCT/JP2021/009050 filed Mar. 8, 2021, claiming priority to Japanese Patent Application No. 2020-040093 filed Mar. 9, 2020, the entire contents of which all are incorporated herein by reference.

TECHNICAL FIELD

The present disclosure relates to a luminescent material, and a method of producing the same.

BACKGROUND ART

Core-shell semiconductor nanoparticles are characterized by having a high emission efficiency and exhibiting an emission spectrum with a narrow full width at half maximum, and the emission color can be controlled over a wide wavelength range by modifying the size of the core-shell semiconductor nanoparticles. These properties are excellent for the use in high-efficiency and high-color-rendering illuminators and wide-color-gamut displays. Therefore, core-shell semiconductor nanoparticles have been attracting attention as a next-generation luminescent material. However, since core-shell semiconductor nanoparticles have a high surface area to volume ratio, they have a low chemical stability and are easily deteriorated particularly by water, oxygen, or the like. Thus, methods of imparting such nanoparticles with barrier properties have been investigated.

For example, WO 2013/041864 discloses a light emitting device that includes luminescent particles in which semiconductor nanoparticles are embedded in a polymeric encapsulation medium, and a luminescent layer in which the luminescent particles are embedded in a host matrix material.

SUMMARY OF INVENTION

Technical Problem

An object of one embodiment of the present invention is to provide a luminescent material having excellent durability.

Solution to Problem

A first embodiment is a luminescent material comprising: second semiconductor nanoparticles (hereinafter, also referred to as "core-shell semiconductor nanoparticles") that contain first semiconductor nanoparticles (hereinafter, also each referred to as "core") and a deposit (hereinafter, also referred to as "shell") arranged on surfaces of the cores, and that emit light when irradiated with light; and a metal compound in which the core-shell semiconductor nanoparticles are embedded. Each core contains $M^1$, $M^2$, and Z. $M^1$ is at least one selected from the group consisting of silver (Ag), copper (Cu), gold (Au) and alkali metals, and contains at least Ag. $M^2$ is at least one selected from the group consisting of aluminum (Al), gallium (Ga), indium (In) and thallium (Tl), and contains at least one of In and Ga. Z contains at least one selected from the group consisting of sulfur (S), selenium (Se), and tellurium (Te). The core has a composition in which a total content ratio of $M^1$ is 10% by mole or more and 30% by mole or less, a total content ratio of $M^2$ is 15% by mole or more and 35% by moleor less, and a total content ratio of Z is 35% by mole or more and 55% by mole or less. The shell contains a semiconductor that is substantially composed of at least one selected from the group consisting of aluminum (Al), gallium (Ga), indium (In), thallium (Tl) and alkali metals, and at least one selected from the group consisting of sulfur (S), oxygen (O), selenium (Se), and tellurium (Te). The metal compound contains at least one of zinc (Zn) and gallium (Ga), and at least one of sulfur (S) and oxygen (O).

A second embodiment is a method of producing a luminescent material, the method comprising: preparing core-shell semiconductor nanoparticles that each contains a core and a shell arranged on a surface of the core, and that emit light when irradiated with light; obtaining a mixture that contains the core-shell semiconductor nanoparticles, a compound containing at least one of Zn and Ga, a compound containing at least one of S and O, and a solvent; and obtaining, from the mixture, a metal compound which contains at least one of Zn and Ga and at least one of S and O, and in which the core-shell semiconductor nanoparticles are embedded. The core contains $M^1$, $M^2$, and Z. $M^1$ is at least one selected from the group consisting of Ag, Cu, Au and alkali metals, and contains at least Ag. $M^2$ is at least one selected from the group consisting of Al, Ga, In and Tl, and contains at least one of In and Ga. Z contains at least one selected from the group consisting of S, Se, and Te. The core has a composition in which a total content ratio of $M^1$ is 10% by mole or more and 30% by mole or less, a total content ratio of $M^2$ is 15% by mole or more and 35% by mole or less, and a total content ratio of Z is 35% by mole or more and 55% by mole or less. The shell is substantially composed of at least one selected from the group consisting of Al, Ga, In, Tl and alkali metals, and at least one selected from the group consisting of S, O, Se, and Te.

Advantageous Effects of Invention

According to an embodiment of the present invention, a luminescent material having excellent durability may be provided.

BRIEF DESCRIPTION OF DRAWINGS

FIG. 1 is a schematic drawing that illustrates a luminescent material containing a metal compound in which core-shell semiconductor nanoparticles are embedded.

FIG. 2 is an exemplary schematic cross-sectional view of a luminescent device.

FIG. 3 is an exemplary schematic cross-sectional view of a luminescent device.

FIG. 4 is an exemplary schematic cross-sectional view of a luminescent device.

FIG. 5 is an emission spectrum of the luminescent material according to Example 1.

FIG. 6 is an emission spectrum of the luminescent material according to Example 2.

DESCRIPTION OF EMBODIMENTS

The term "step" used herein encompasses not only a discrete step but also a step that cannot be clearly distinguished from other steps, as long as the intended purpose of the step is achieved. When there are plural substances that correspond to a component of a composition, an indicated amount of the component contained in the composition means, unless otherwise specified, a total amount of the plural substances existing in the composition. Further, upper limit and lower limit values that are described for a numerical range in the present specification can be arbitrarily selected and combined. Embodiments of the present invention will now be described in detail. It is noted here, however, that the below-described embodiments are merely examples of a luminescent material and a production method thereof that embody the technical ideas of the present invention, and the present invention is not limited to the below-described luminescent material and production method thereof. Further, the members described in Claims are not limited to the members in the below-described embodiments by any means. Particularly, unless otherwise specified, the dimensions, materials, shapes, relative arrangements, and the like of the constituent members described in the embodiments are not intended to limit the scope of the present invention thereto, and are merely examples.

Luminescent Material

The luminescent material contains second semiconductor nanoparticles, and a metal compound in which the second semiconductor nanoparticles are embedded. The second semiconductor nanoparticles contains first semiconductor nanoparticles, and a deposit arranged on the surfaces of the respective first semiconductor nanoparticles. The deposit may cover the surface of each first semiconductor nanoparticle. Accordingly, in a surface analysis of the second semiconductor nanoparticles, elements (e.g., Ag) that may be contained only in the first semiconductor nanoparticles do not have to be detected. Hereinafter, for the sake of convenience, the first semiconductor nanoparticles are each referred to as "core", the deposit is referred to as "shell", and the second semiconductor nanoparticles are referred to as "core-shell semiconductor nanoparticles".

The luminescent material contains: core-shell semiconductor nanoparticles that each contains a core and a shell arranged on the surface of the core, and that emit light when irradiated with light; and a metal compound in which the core-shell semiconductor nanoparticles are embedded. The core may be, for example, a semiconductor containing $M^1$, $M^2$, and Z. $M^1$ is at least one selected from the group consisting of Ag, Cu, Au and alkali metals, and may contain at least Ag. $M^2$ is at least one selected from the group consisting of Al, Ga, In and Tl, and may contain at least one of In and Ga. Z may contain at least one selected from the group consisting of S, Se, and Te. The Core may have a composition in which a total content ratio of $M^1$ is 10% by mole or more and 30% by mole or less, a total content ratio of $M^2$ is 15% by mole or more and 35% by mole or less, and a total content ratio of Z is 35% by mole or more and 55% by mole or less. The shell may contain a semiconductor that is substantially composed of at least one selected from the group consisting of Al, Ga, In, Tl and alkali metals, and at least one selected from the group consisting of S, O, Se, and Te. The metal compound in which the core-shell semiconductor nanoparticles are embedded may contain at least one of Zn and Ga, and at least one of S and O.

By constituting a luminescent material from core-shell semiconductor nanoparticles having a specific configuration and a specific metal compound in which the core-shell semiconductor nanoparticles are embedded, the durability of the luminescent material is improved, and deterioration of the emission characteristics of the luminescent material, which is caused by water, oxygen and the like in the environment, is inhibited. The metal compound is believed to function as, for example, a matrix in which the core-shell semiconductor nanoparticles are embedded.

The core-shell semiconductor nanoparticles are at least partially embedded in the metal compound to constitute the luminescent material. In the luminescent material, plural particles may be embedded in the metal compound in an aggregated state, or individual particles may be embedded independently from one another in the metal compound.

An exemplary configuration of the luminescent material will now be described referring to a drawing. FIG. 1 is a drawing that schematically illustrates an example of a luminescent material 1. The luminescent material 1 is constituted by core-shell semiconductor nanoparticles 2, and a metal compound 3 in which the core-shell semiconductor nanoparticles 2 are embedded. In FIG. 1, the core-shell semiconductor nanoparticles 2 are embedded in the metal compound 3, which serves as a matrix, in the form of individual particles or aggregated particles. Some of the core-shell semiconductor nanoparticles 2 may be partially exposed from the surface of the metal compound 3. In FIG. 1, for the sake of simplicity, the core-shell semiconductor nanoparticles 2 have a spherical shape; however, the shape of the core-shell semiconductor nanoparticles is not limited to a spherical shape. Further, in FIG. 1, the metal compound 3 is illustrated to have a cubic shape; however, the shape of the metal compound 3 is not limited to a cubic shape.

Core-Shell Semiconductor Nanoparticles

The core-shell semiconductor nanoparticles each contains: a core that contains a semiconductor containing $M^1$, $M^2$, and Z; and a shell that contains a semiconductor substantially composed of at least one selected from the group consisting of Al, Ga, In, Tl and alkali metals, and at least one selected from the group consisting of S, O, Se, and Te. $M^1$ constituting the core may be at least one selected from the group consisting of Ag, Cu, Au and alkali metals, and may contain at least Ag. $M^2$ may be at least one selected from the group consisting of Al, Ga, In and Tl, and may contain at least one of In and Ga. Z may contain at least one selected from the group consisting of S, Se, and Te. When the composition of the core has an amount of 1 mole, a total content ratio of $M^1$ may be, for example, 10% by mole to 30% by mole, and it is preferably 15% by mole to 25% by mole. A total content ratio of $M^2$ in the composition of the core may be, for example, 15% by mole or more and 35% by mole or less 0, and it is preferably 20% by mole or more and 30% by mole or less. A total content ratio of Z in the composition of the core may be, for example, 35% by mole or more and 55% by mole or less, and it is preferably 40% by mole or more and 55% by mole or less.

In the composition of the core, a ratio ($M^2/M^1$) of a total number of $M^2$ atoms with respect to a total number of $M^1$ atoms is, for example, 0.5 or more and 10 or less, preferably 0.8 or more and 5 or less, more preferably 0.9 or more and 2 or less. Further, in the composition of the core, a ratio ($Z/M^1$) of a total number of Z atoms with respect to a total number of $M^1$ atoms is, for example, 1 or more and 10 or less, preferably 1.5 or more and 8 or less, more preferably 2 or more and 3 or less. The core may have a composition represented by, for example, a composition formula $M^1M^2Z_2$.

Semiconductor nanoparticles that contain Ag, In and S, and have a tetragonal, hexagonal, or orthorhombic crystal structure are introduced in literatures and the like generally as those represented by a composition formula $AgInS_2$. However, such semiconductor nanoparticles do not actually have a stoichiometric composition represented by the above-described composition formula in some cases and, particularly, the ratio ($M^2/M^1$) of the number of $M^2$ atoms with respect to the number of $M^1$ atoms may be smaller than 1, or conversely, 1 or larger. In addition, a sum of the number of $M^1$ atoms and the number of $M^2$ atoms is not always equal to the number of Z atoms. Therefore, in the present specification, where it is irrelevant whether a semiconductor containing specific elements has a stoichiometric composition or not, the composition of the semiconductor may be represented by a formula in which the constituent elements are connected by "-" as in $M^1$-$M^2$-Z.

Among semiconductors containing the above-described elements, those having a hexagonal crystal structure are wurtzite-type semiconductors, and those having a tetragonal crystal structure are chalcopyrite-type semiconductors. The crystal structure is identified by, for example, measuring the X-ray diffraction (XRD) pattern obtained by XRD analysis. Specifically, an XRD pattern obtained from semiconductor nanoparticles is compared with known XRD patterns of semiconductors represented by a composition $AgInS_2$, or with XRD patterns determined by simulation using crystal structure parameters. If the pattern of the semiconductor contained in the core corresponds to any of the known patterns and simulated patterns, the crystal structure of the core is said to be that of the corresponding known or simulated pattern.

An aggregate of the semiconductor nanoparticles serving as cores may contain a mixture of semiconductor nanoparticles having different crystal structures, such as tetragonal, hexagonal, and orthorhombic crystal structures. In this case, peaks derived from the plural kinds of crystal structures are observed in the XRD pattern. The core-shell semiconductor nanoparticles are substantially composed of tetragonal crystals and, therefore, a peak corresponding to the tetragonal crystals is observed, while peaks derived from other crystal structures are substantially not observed.

$M^1$ may contain at least Ag, and may further contain at least one selected from the group consisting of Cu, Au, and alkali metals. $M^1$ may be substantially composed of Ag, or may be substantially composed of Ag and Cu, or Ag and an alkali metal. The term "substantially" used herein indicates that a ratio of elements other than Ag, Cu, and the alkali metal with respect to a total amount of Ag, Cu, and the alkali metal is, for example, 10% by mole or less, preferably 5% by mole or less, more preferably 1% by mole or less. Examples of the alkali metal contained in $M^1$ include lithium (Li), sodium (Na), potassium (K), rubidium (Rb), and cesium (Cs).

When $M^1$ contains Ag and Cu, a ratio (Cu/(Ag+Cu)) of the number of Cu atoms with respect to a total number of Ag and Cu atoms may be, for example, lower than 1, and it is preferably 0.8 or lower, more preferably 0.4 or lower, still more preferably 0.2 or lower. Further, this ratio is, for example, higher than 0, preferably 0.05 or higher, more preferably 0.1 or higher. When $M^1$ contains Ag and an alkali metal (hereinafter, may be abbreviated as $M^a$), a ratio ($M^a$/(Ag+$M^a$)) of the number of alkali metal ($M^a$) atoms with respect to a total number of Ag atoms and alkali metal ($M^a$) atoms may be, for example, lower than 1, and it is preferably 0.8 or lower, more preferably 0.4 or lower, still more preferably 0.2 or lower. Further, this ratio is, for example, higher than 0, preferably 0.05 or higher, more preferably 0.1 or higher.

$M^2$ contains at least one of In and Ga, and may further contain at least one selected from the group consisting of Al and Tl. $M^2$ is preferably substantially composed of at least one of In and Ga. The term "substantially" used herein indicates that a ratio of elements other than In and Ga with respect to a total amount of In and Ga is, for example, 10% by mole or less, preferably 5% by mole or less, more preferably 1% by mole or less.

When $M^2$ contains at least one of In and Ga, a ratio (Ga/(Ga+In)) of the number of Ga atoms with respect to a total number of In and Ga atoms may be, for example, 0.95 or lower, and it is preferably 0.2 to 0.9.

Z contains at least one selected from the group consisting of S, Se, and Te. Z may contain at least S, and may be partially substituted and contain at least one of Se and Te. Z is preferably substantially composed of S, Se, or Te. The term "substantially" used herein indicates that a ratio of elements other than Z with respect to Z is, for example, 10% by mole or less, preferably 5% by mole or less, more preferably 1% by mole or less.

Examples of a combination of $M^1$, $M^2$, and Z ($M^1/M^2$/Z) include Cu/In/S, Ag/In/S, Ag/(In,Ga)/S, Ag/In/Se, Ag/(In, Ga)/Se, Ag/In/Te, Ag/(In,Ga)/Te, Ag/Ga/S, Ag/Ga/Se, and Ag/Ga/Te.

The semiconductor contained in the core may be substantially composed of Ag, Cu, an alkali metal, In, Ga, S, and the above-described elements partially substituting these elements. The term "substantially" used herein takes into consideration that elements other than Ag, Cu, alkali metal, In, Ga, S, and the elements partially substituting these elements may be unavoidably incorporated due to, for example, contamination with impurities.

The core may have an average particle size of, for example, 10 nm or smaller, particularly 8 nm or smaller. The average particle size of the semiconductor nanoparticles may be in a range of 1.5 nm or lager and 10 nm or smaller, particularly in a range of 1.7 nm or larger and 7.5 nm or smaller. When the average particle size of the semiconductor nanoparticles is equal to or smaller than the above-described upper limit value, a quantum size effect is likely to be obtained.

The average particle size of the semiconductor nanoparticles may be determined from, for example, a TEM image captured using a transmission electron microscope (TEM). The particle size of individual semiconductor nanoparticle specifically refers to the length of the longest line segment among those line segments that exist inside the particle observed in a TEM image and connect two arbitrary points on the circumference of the particle.

The average particle size of the semiconductor nanoparticles is determined by measuring the particle size for all measurable particles observed in a TEM image captured at a magnification of ×50,000 to ×150,000, and calculating the arithmetic mean of the thus measured values. The "measurable" particles are those particles whose outlines are entirely observable in a TEM image. Accordingly, in a TEM image, a particle whose outline is partially not included in the captured area and thus appears to be "cut" is not a measurable particle. When a single TEM image contains 100 or more measurable particles, the average particle size is determined using this TEM image. Meanwhile, when a single TEM image contains less than 100 measurable particles, another TEM image is further captured at a different position, and the particle size is measured for 100 or more measurable particles contained in two or more TEM images to determine the average particle size.

The shell is a semiconductor having a larger band-gap energy than that of the semiconductor constituting the core, and may be formed of a semiconductor that contains at least one selected from the group consisting of Group 13 elements and alkali metals, and a Group 16 element. The shell may be substantially a semiconductor that is composed of at least one selected from the group consisting of Al, Ga, In, Tl and alkali metals, and at least one selected from the group consisting of S, O, Se, and Te. The term "substantially" used herein indicates that, when a total number of atoms of all elements contained in the shell is taken as 100%, a ratio of the number of atoms of elements other than Al, Ga, In, Tl, alkali metals, S, O, Se, and Te is, for example, 10% or less, preferably 5% or less, more preferably 1% or less.

The shell may be formed by selecting its composition and the like in accordance with the band-gap energy of the above-described semiconductor constituting the core. Alternatively, when the composition and the like of the shell are predetermined, the core may be designed such that the band-gap energy of the semiconductor constituting the core is smaller than that of the shell. Generally, a semiconductor composed of Ag—In—S has a band-gap energy of 1.8 ev or higher and 1.9 ev or lower.

Specifically, the semiconductor constituting the shell may have a band-gap energy of, for example, 2.0 eV or higher and 5.0 eV or lower, particularly 2.5 eV or higher and 5.0 eV or lower. The band-gap energy of the shell may be larger than that of the core by, for example, about 0.1 eV or higher and 3.0 eV or lower, particularly about 0.3 eV or higher and 3.0 eV or lower, more particularly about 0.5 eV or higher and 1.0 eV or lower. When the difference between the band-gap energy of the semiconductor constituting the shell and that of the semiconductor constituting the core is equal to or greater than the above-described lower limit value, the ratio of emission other than band-edge emission in the emission from the core tends to be reduced, resulting in an increase in the ratio of band-edge emission.

Further, the band-gap energy of the semiconductor constituting the core and that of the semiconductor constituting the shell are preferably selected such that type-I band alignment where the band-gap energy of the core exists between the band-gap energy of the shell is formed at heterojunction of the core and the shell. The formation of type-I band alignment enables to obtain the band-edge emission from the core in a more favorable manner. In the type-I band alignment, a barrier of at least 0.1 eV is preferably formed between the band gap of the core and the band gap of the shell and, for example, a barrier of 0.2 eV or higher, or 0.3 eV or higher may be formed. An upper limit of the barrier is, for example, 1.8 eV or lower, particularly 1.1 eV or lower. When the barrier is equal to or more than the above-described lower limit value, the ratio of emission other than band-edge emission in the emission from the core tends to be reduced, resulting in an increase in the ratio of band-edge emission.

The semiconductor constituting the shell may contain In or Ga as the Group 13 element. Further, the shell may contain S as the Group 16 element. A semiconductor containing In or Ga, or S tends to have a larger band-gap energy than the above-described core. Further, the semiconductor constituting the shell may contain elemental oxygen (O). The semiconductor containing In or Ga, S, and O tends to have a larger band-gap energy than the above-described core.

The semiconductor of the shell may have a crystal system conforming to that of the semiconductor of the core, and may have a lattice constant that is the same as or close to that of the semiconductor of the core. The shell formed of a semiconductor which has a crystal system conforming to that of the semiconductor of the core and a lattice constant close to that of the semiconductor of the core (including a case where a multiple of the lattice constant of the shell is similar to the lattice constant of the core) may favorably cover the periphery of the core. For example, the core generally has a tetragonal crystal system, and examples of a crystal system conforming thereto include a tetragonal system and an orthorhombic crystal system. When Ag—In—S has a tetragonal crystal system, it is preferred that the lattice constants of the constituent elements be 0.5828 nm, 0.5828 nm, and 1.119 nm, respectively; and that the shell covering this Ag—In—S have a tetragonal or cubic crystal system, and its lattice constants or multiples thereof be close to the lattice constants of Ag—In—S. Alternatively, the shell may be amorphous.

Whether or not an amorphous shell is formed may be verified based on the observation of the semiconductor nanoparticles having a core-shell structure by HAADF-STEM. When an amorphous shell is formed, specifically, in HAADF-STEM, a central part is observed with a regular pattern (e.g., a stripe pattern or a dot pattern) and its surrounding part is observed with no regular pattern. According to HAADF-STEM, a substance having a regular structure as in the case of a crystalline substance is observed as an image having a regular pattern, while a substance having no regular structure as in the case of an amorphous substance is not observed as an image having a regular pattern. Therefore, when the shell is amorphous, the shell may be observed as a part that is clearly different from the core observed as an image having a regular pattern (as described above, the core may have a crystal structure of a tetragonal system or the like).

When the shell is formed of Ga—S, since Ga is an element lighter than Ag, In and the like that are contained in the core, the shell tends to be observed darker than the core in an image obtained by HAADF-STEM.

Whether or not an amorphous shell is formed may also be verified by observing the semiconductor nanoparticles having a core-shell structure under a high-resolution transmission electron microscope (HRTEM). In an image obtained by HRTEM, the core portion is observed as a crystal lattice image (an image having a regular pattern) while the shell portion is not observed as a crystal lattice image, and the shell portion is observed as a part having a black and white contrast but no regular pattern.

Meanwhile, the shell preferably does not form a solid solution with the core. If the shell forms a solid solution with the core, since the shell and the core are integrated together, band-edge emission may not be obtained. For example, it has been confirmed that band-edge emission cannot be obtained from the core even when the surface of the core composed of Ag—In—S is covered with zinc sulfide (Zn—S) having a stoichiometric or non-stoichiometric composition. Zn—S, in its relationship with Ag—In—S, satisfies the above-described conditions in terms of band-gap energy, and gives a type-I band alignment. Nevertheless, band-edge emission was not obtained from such core-shell semiconductor nanoparticles, and it is surmised that the reason for this is because the semiconductor of the core and Zn—S formed a solid solution, eliminating the core-shell interface.

The shell may contain, but not limited to, a combination of In and S, a combination of Ga and S, or a combination of In, Ga, and S, as a combination of Group 13 and Group 16 elements. The combination of In and S may be in the form of indium sulfide, the combination of Ga and S may be in the form of gallium sulfide, and the combination of In, Ga, and S may be in the form of indium gallium sulfide. Indium sulfide constituting the shell does not necessarily have a stoichiometric composition ($In_2S_3$) and, in this sense, indium sulfide may be hereinafter represented by a formula $InS_x$ (wherein, x represents an arbitrary number that is not limited to an integer, such as 0.8 or more and 1.5 or less). Similarly, gallium sulfide does not necessarily have a stoichiometric composition ($Ga_2S_3$) and, in this sense, gallium sulfide may be hereinafter represented by a formula GaSx (wherein, x represents an arbitrary number that is not limited to an integer, such as 0.8 or more and 1.5 or less). Indium gallium sulfide may have a composition represented by $In_{2(1-y)}Ga_{2y}S_3$ (wherein, y represents an arbitrary number that is larger than 0 but smaller than 1), or $In_pGa_{(1-p)}S_q$ (wherein, p represents an arbitrary number that is larger than 0 but smaller than 1, and q represents an arbitrary number that is not limited to an integer).

The form of elemental oxygen constituting the shell is not clear; however, it may be, for example, Ga—O—S or $Ga_2O_3$.

Indium sulfide has a band-gap energy of 2.0 eV or higher and 2.4 eV or lower, and indium sulfide with a cubic crystal system has a lattice constant of 1.0775 nm. Gallium sulfide has a band-gap energy of about 2.5 eV or higher and 2.6 eV or lower, and gallium sulfide with a tetragonal crystal system has a lattice constant of 0.5215 nm. It is noted here, however, that the above-described crystal systems and the like are all reported values, and the shell does not necessarily satisfy these reported values in the actual semiconductor nanoparticles having a core-shell structure.

Indium sulfide and gallium sulfide may be preferably used as the semiconductor constituting the shell arranged on the surface of the core. Particularly, gallium sulfide is preferably used because of its large band-gap energy. When gallium sulfide is used, a stronger band-edge emission may be obtained as compared to a case of using indium sulfide.

The core-shell semiconductor nanoparticles may have an average particle size of, for example, 50 nm or smaller. From the standpoints of the ease of production and the quantum yield of band-edge emission, the average particle size is preferably in a range of 1 nm or larger and 20 nm or smaller, more preferably 1.6 nm or larger and 8 nm or smaller, particularly preferably 2 nm or larger and 7.5 nm or smaller. The average particle size of the core-shell semiconductor nanoparticles is measured in the same manner as the average particle size of the above-described semiconductor nanoparticles.

The shell has a thickness in a range of, for example, 0.1 nm or more and 50 nm or less, preferably in a range of 0.1 nm or more and 10 nm or less, more preferably in a range of 0.3 nm or more and 3 nm or less. When the thickness of the shell is equal to or larger than the above-described lower limit value, the effect provided by covering the cores with the shell is sufficiently exerted, so that band-edge emission is likely to be obtained.

The thickness of the shell may be determined by, for example, observing the semiconductor nanoparticles having a core-shell structure by HAADF-STEM. Particularly, when the shell is amorphous, the thickness of the shell easily observable by HAADF-STEM as a part different from a core may be easily determined. When the thickness of the shell is not uniform, the smallest thickness is defined as the thickness of the shell of a particle.

Alternatively, the average particle size of cores may be measured in advance before covering the cores with the shell. The average particle size of the semiconductor nanoparticles having a core-shell structure is then measured, and the thickness of the shell may be determined by calculating the difference between the thus measured average particle size and the average particle size of the cores that has been measured in advance.

The core-shell semiconductor nanoparticles preferably have a substantially tetragonal crystal structure. The crystal structure is identified by, for example, measuring the X-ray diffraction (XRD) pattern obtained by XRD analysis in the same manner as described above. The term "substantially tetragonal crystal" used herein indicates that a ratio of the height of a peak at about 48°, which represents hexagonal and orthorhombic crystals, with respect to the height of a main peak at about 26°, which represents a tetragonal crystal, is 10% or less.

The core-shell semiconductor nanoparticles, when irradiated with light such as ultraviolet light, visible light, or infrared radiation, emit light having a longer wavelength than the irradiated light. Specifically, when irradiated with, for example, ultraviolet light, visible light, or infrared radiation, the semiconductor nanoparticles may emit light that has a longer wavelength than the irradiated light, with the emission lifetime of the main component being 200 ns or shorter and/or the emission spectrum having a full width at half maximum of 70 nm or less.

When irradiated with light having a peak at about 450 nm, the core-shell semiconductor nanoparticles may emit light having an emission peak wavelength in a range of 500 nm to 820 nm. In the emission spectrum, the full width at half maximum of the emission peak may be, for example, 150 nm or less, and it is preferably 100 nm or less, more preferably 70 nm or less, particularly preferably 50 nm or less. A lower limit value of the full width at half maximum may be, for example, not less than 10 nm. Further, the full width at half maximum may be, for example, 250 meV or less, preferably 210 meV or less, more preferably 190 meV or less. A lower limit of the full width at half maximum may be, for example, not less than 35 meV.

The emission of the core-shell semiconductor nanoparticles may include defect emission (e.g., donor-acceptor emission) in addition to band-edge emission; however, the emission is preferably substantially band-edge emission alone. Defect emission generally has a longer emission lifetime and a broader spectrum with a peak on the longer wavelength side as compared to band-edge emission. The expression "substantially band-edge emission alone" used herein means that the purity of the band-edge emission component in the emission spectrum may be 40% or higher, and it is preferably 60% or higher. The "purity of the band-edge emission component" is represented by the following formula when the peaks of the emission spectrum are separated into two, which are a band-edge emission peak and a defect emission peak, and the areas of these peaks are denoted as $a_1$ and $a_2$, respectively, provided that each peak is assumed to have a shape of normal distribution:

$$\text{Purity (\%) of band-edge emission component} = a_1/(a_1+a_2)\times 100$$

When the emission spectrum contains no band-edge emission at all, i.e., when the emission spectrum contains only defect emission, the purity of the band-edge emission component is 0%; when band-edge emission and defect emission have the same peak area, the purity of the band-edge emission component is 50%; and when the emission spectrum contains only band-edge emission, the purity of the band-edge emission component is 100%.

The quantum yield of the band-edge emission is defined as a value obtained by multiplying the internal quantum yield, which is measured using a quantum yield measuring device at an excitation wavelength of 450 nm and a temperature of 25° C. and calculated in a range of 506 nm to 882 nm, by the above-described purity of the band-edge emission component, and dividing the product by 100. The quantum yield of the band-edge emission of the core-shell semiconductor nanoparticles is, for example, 10% or more, preferably 20% or more.

The peak position of the band-edge emission by the core-shell semiconductor nanoparticles may be shifted by modifying the particle size of the core-shell semiconductor nanoparticles. For example, when the particle size of the core-shell semiconductor nanoparticles is reduced, the peak wavelength of the band-edge emission tends to shift to the shorter wavelength side. A further reduction in the particle size of the core-shell semiconductor nanoparticles tends to further reduce the spectral full width at half maximum of the band-edge emission.

The core-shell semiconductor nanoparticles also preferably exhibit an absorption or excitation spectrum (also referred to as "fluorescence excitation spectrum") with an exciton peak. An exciton peak is a peak resulting from exciton formation, and the appearance of this peak in an absorption or excitation spectrum means that the particles have a small particle size distribution and few crystal defects, and are thus suitable for band-edge emission. A sharper exciton peak means that an aggregate of the core-shell semiconductor nanoparticles contains a greater amount of particles having a uniform particle size with few crystal defects. Accordingly, it is expected that the core-shell semiconductor nanoparticles exhibit emission with a narrower full width at half maximum and an improved emission efficiency. In the absorption or excitation spectrum of the core-shell semiconductor nanoparticles, an exciton peak is observed, for example, in a range of 350 nm or more and 1,000 nm or less. The excitation spectrum for checking the presence or absence of an exciton peak may be measured by setting the observation wavelength around the peak wavelength.

The shell surfaces of the core-shell semiconductor nanoparticles may be modified with a surface modifier. Specific examples of the surface modifier include an amino alcohol having 2 or more and 20 or less carbon atoms, an ionic surface modifier, a nonionic surface modifier, a nitrogen-containing compound containing a hydrocarbon group having 4 or more and 20 or less carbon atoms, a sulfur-containing compound containing a hydrocarbon group having 4 or more and 20 or less carbon atoms, an oxygen-containing compound containing a hydrocarbon group having 4 or more and 20 or less carbon atoms, and a phosphorus-containing compound containing a hydrocarbon group having 4 or more and 20 or less carbon atoms. These surface modifiers may be used in combination of two or more different kinds thereof.

The amino alcohol may be any compound as long as it has an amino group and an alcoholic hydroxyl group and contains a hydrocarbon group having 2 or more and 20 or less carbon atoms. The number of carbon atoms in the amino alcohol is preferably 10 or less, more preferably 6 or less. The hydrocarbon group constituting the amino alcohol may be derived from a hydrocarbon such as a linear, branched, or cyclic alkane, alkene, or alkyne. The expression "derived from a hydrocarbon" used herein means that the hydrocarbon group is formed by removing at least two hydrogen atoms from the hydrocarbon. Specific examples of the amino alcohol include amino ethanol, amino propanol, amino butanol, amino pentanol, amino hexanol, and amino octanol. It is believed that the amino group of the amino alcohol binds to the surface of the respective core-shell semiconductor nanoparticles and the hydroxyl group is exposed on the particle outermost surface on the opposite side, as a result of which the polarity of the core-shell semiconductor nanoparticles is changed, and the dispersibility in alcohol-based solvents (e.g., methanol, ethanol, propanol, and butanol) is improved.

Examples of the ionic surface modifier include nitrogen-containing compounds, sulfur-containing compounds, and oxygen-containing compounds, which contain an ionic functional group in the respective molecules. The ionic functional group may be either cationic or anionic, and the ionic surface modifier preferably contains at least a cationic group. With regard to specific examples of the surface modifier and a surface modification method, reference may be made to, for example, Chemistry Letters, Vol. 45, pp 898-900, 2016.

The ionic surface modifier may be, for example, a sulfur-containing compound containing a tertiary or quaternary alkylamino group. The number of carbon atoms of the alkyl group in the alkylamino group may be, for example, 1 or more and 4 or less. The sulfur-containing compound may also be an alkyl or alkenylthiol having 2 or more and 20 or less carbon atoms. Specific examples of the ionic surface modifier include hydrogen halides of dimethylaminoethanethiol, halogen salts of trimethylammonium ethanethiol, hydrogen halides of dimethylaminobutanethiol, and halogen salts of trimethylammonium butanethiol.

Examples of the nonionic surface modifier include nitrogen-containing compounds, sulfur-containing compounds, and oxygen-containing compounds, which have a nonionic functional group containing an alkylene glycol unit, an alkylene glycol monoalkyl ether unit, or the like. The number of carbon atoms of the alkylene group in the alkylene glycol unit may be, for example, 2 or more and 8 or less, and it is preferably 2 or more and 4 or less. Further, the number of repeating alkylene glycol units may be, for example, 1 or more and 20 or less, and it is preferably 2 or more and 10 or less. The nitrogen-containing compounds, the sulfur-containing compounds, and the oxygen-containing compounds, which are included in the nonionic surface modifier, may contain an amino group, a thiol group, and a hydroxy group, respectively. Specific examples of the nonionic surface modifier include methoxytriethyleneoxy ethanethiol, and methoxyhexaethyleneoxy ethanethiol.

Examples of the nitrogen-containing compound containing a hydrocarbon group having 4 or more and 20 oe less carbon atoms include amines and amides. Examples of the sulfur-containing compound containing a hydrocarbon group having 4 or more and 20 or less carbon atoms include thiols. Examples of the oxygen-containing compound containing a hydrocarbon group having 4 or more and 20 or less carbon atoms include carboxylic acids, alcohols, ethers, aldehydes, and ketones. Examples of the phosphorus-containing compound containing a hydrocarbon group having 4 or more and 20 or less carbon atoms include trialkyl phosphines, triaryl phosphines, trialkyl phosphine oxides, and triaryl phosphine oxides.

A content ratio of the core-shell semiconductor nanoparticles in the luminescent material may be, for example, 0.01% by mass or more and 10% by mass or less, and it is preferably 0.1% by mass or more and 5% by mass or less, with respect to a total mass of the luminescent material.

The metal compound constituting the luminescent material contains at least one of Zn and Ga, and at least one of S and O, and the core-shell semiconductor nanoparticles are embedded therein. The metal compound may be substantially a compound that is composed of at least one of Zn and Ga, and at least one of S and O. The term "substantially" used herein indicates that, when a total number of atoms of all elements contained in the metal compound is taken as 100%, a ratio of the number of atoms of elements other than Zn, Ga, S, and O is, for example, 10% or less, preferably 5% or less, more preferably 3% or less, particularly preferably 1% or less. The ratio of each element contained in the metal compound may be verified by, for example, ICP emission analysis for Zn, Ga, and S, or by elemental analysis based on a combustion method for O. The metal compound may also contain at least one selected from the group consisting of a metal sulfide, a metal oxysulfide, and a metal oxide. Whether or not the metal compound contains at least one selected from the group consisting of a metal sulfide, a metal oxysulfide, and a metal oxide may be verified by, for example, SEM-EPMA.

The metal sulfide may contain at least one of Zn and Ga, along with S. When the metal sulfide is substantially formed of Zn and S, the metal sulfide may have a composition represented by ZnS. The term "substantially" used herein indicates that, when a total number of atoms of all elements contained in the metal sulfide is taken as 100%, a ratio of the number of atoms of elements other than Zn and S is, for example, 5% or less, preferably 3% or less, more preferably 1% or less. Meanwhile, when the metal sulfide is substantially formed of Ga and S, the metal sulfide may have a composition represented by $Ga_2S_3$. The term "substantially" used herein indicates that, when a total number of atoms of all elements contained in the metal sulfide is taken as 100%, a ratio of the number of atoms of elements other than Ga and S is, for example, 5% or less, preferably 3% or less, more preferably 1% or less.

The metal oxysulfide may contain at least one of Zn and Ga, along with S and O. For example, when the metal oxysulfide is substantially formed of Zn, S, and O, the metal oxysulfide may have a composition represented by $ZnO_xS_{(1-x)}$ ($0<x<1$). The term "substantially" used herein indicates that, when a total number of atoms of all elements contained in the metal oxysulfide is taken as 100%, a ratio of the number of atoms of elements other than Zn, S, and O is, for example, 5% or less, preferably 3% or less, more preferably 1% or less. Meanwhile, when the metal oxysulfide is substantially formed of Ga, S, and O, the metal oxysulfide may have a composition represented by $Ga_2O_xS_{(3-x)}$ ($0<x<3$). The term "substantially" used herein indicates that, when a total number of atoms of all elements contained in the metal oxysulfide is taken as 100%, a ratio of the number of atoms of elements other than Ga, S, and O is, for example, 5% or less, preferably 3% or less, more preferably 1% or less.

The metal oxide may contain at least one of Zn and Ga, along with O. For example, when the metal oxide is substantially formed of Zn and O, the metal oxide may have a composition represented by ZnO. The term "substantially" used herein indicates that, when a total number of atoms of all elements contained in the metal oxide is taken as 100%, a ratio of the number of atoms of elements other than Zn and O is, for example, 5% or less, preferably 3% or less, more preferably 1% or less. Meanwhile, when the metal oxide is substantially formed of Ga and O, the metal oxide may have a composition represented by $Ga_2O_3$. The term "substantially" used herein indicates that, when a total number of atoms of all elements contained in the metal oxide is taken as 100%, a ratio of the number of atoms of elements other than Ga and O is, for example, 5% or less, preferably 3% or less, more preferably 1% or less.

The metal compound in which the core-shell semiconductor nanoparticles are embedded may be, as described below, a compound generated by a solution reaction. The metal compound may also be a solvolysis product obtained by, for example, reacting an organic or inorganic acid salt of a metal with at least one of a sulfur-containing compound and an oxygen-containing compound at a low temperature of 100° C. or lower in the presence of water, alcohol, or the like. The metal compound may be crystalline or amorphous. The crystal state of the metal compound may be verified by, for example, X-ray diffractometry.

Method of Producing Luminescent Material

A method of producing a luminescent material includes: the providing step of providing core-shell semiconductor nanoparticles that each contains a core and a shell arranged on the surface of the core, and that emit light when irradiated with light; the mixing step of obtaining a mixture for the production of a luminescent material, which mixture contains the core-shell semiconductor nanoparticles, a compound containing at least one of Zn and Ga, a compound containing at least one of S and O, and a solvent; and the synthesis step of obtaining, from the mixture for the production of a luminescent material, a metal compound which contains at least one of Zn and Ga and at least one of S and O, and in which the core-shell semiconductor nanoparticles are embedded. The core of each core-shell semiconductor nanoparticle may contain $M^1$, $M^2$ and Z, and may be a semiconductor containing $M^1$, $M^2$, and Z. $M^1$ is at least one selected from the group consisting of Ag, Cu, Au and alkali metals, and contains at least Ag. $M^2$ is at least one selected from the group consisting of Al, Ga, In and Tl, and contains at least one of In and Ga. Z contains at least one selected from the group consisting of S, Se, and Te. The core may have a composition in which a total content ratio of $M^1$ is 10% by mole or more and 30% by mole or less, a total content ratio of $M^2$ is 15% by mole or more and 35% by mole or less, and a total content ratio of Z is 35% by mole or more and 55% by mole or less. The shell may be substantially composed of at least one selected from the group consisting of Al, Ga, In, Tl and alkali metals, and at least one selected from the group consisting of S, O, Se, and Te.

By allowing the compound containing at least one of Zn and Ga and the compound containing at least one of S and O to react with each other via the solvent in the presence of the core-shell semiconductor nanoparticles, a metal compound that contains at least one of Zn and Ga as a metal is precipitated. This metal compound is precipitates in such a manner that the core-shell semiconductor nanoparticles are embedded therein; therefore, a luminescent material may be efficiently produced by a solution reaction.

Providing Step

In the providing step, core-shell semiconductor nanoparticles are provided. The core-shell semiconductor nanoparticles may be selected from commercially available products as appropriate, or may be provided by producing core-shell semiconductor nanoparticles having desired properties. With regard to a method of producing such core-shell semiconductor nanoparticles, reference may be made to the descriptions of, for example, Japanese Laid-Open Patent Publication No. 2018-044142, WO 2018/159699, WO 2019/160094, and U.S. Patent No. 2019/0345384. Specifically, the core-shell semiconductor nanoparticles may be produced, for example, in the following manner.

A first production method of the semiconductor nanoparticles serving as cores may include: providing a first mixture that contains an $M^1$-containing salt, an $M^2$-containing salt, and an organic solvent; raising the temperature of the first mixture; and adding a Z supply source to the thus temperature-raised mixture. A second production method of the semiconductor nanoparticles serving as cores may include:

providing a second mixture that contains an $M^1$-containing salt, an $M^2$-containing salt, a Z supply source, and an organic solvent; and performing a heat treatment of the second mixture.

Examples of the $M^1$-containing salt and the $M^2$-containing salt that are used in the first and the second production methods include organic acid salts and inorganic acid salts. Specifically, examples of the inorganic acid salts include nitrates, sulfates, hydrochlorides, sulfonates, and carbonates, and examples of the organic acid salts include acetates and acetylacetonates. Thereamong, organic acid salts are preferred since they are highly soluble in organic solvents.

Examples of the Z supply source used in the first and the second production methods include simple substance of Z and Z-containing compounds. When Z is S, examples of an S supply source include sulfur and sulfur-containing compounds. Specific examples of the sulfur-containing compounds include: β-dithiones, such as 2,4-pentanedithione; dithiols, such as 1,2-bis(trifluoromethyl)ethylene-1,2-dithiol; dialkyl dithiocarbamates, such as diethyl dithiocarbamates; thiourea; and alkylthioureas containing an alkyl group having 1 to 18 carbon atoms, such as 1,3-dialkylthiourea, 1,1-dialkylthiourea, alkylthiourea, 1,1,3-trialkylthiourea, and 1,1,3,3-tetraalkylthiourea. The S supply source is preferably a sulfur-containing compound that may be dissolved in an organic solvent. From the standpoints of solubility and reactivity, an alkylthiourea is more preferably used, and 1,3-dialkylthiourea is still more preferably used. The alkyl group of the alkylthiourea has preferably 1 to 12 carbon atoms, more preferably 1 to 8 carbon atoms, still more preferably 1 to 6 carbon atoms, yet still more preferably 1 to 4 carbon atoms, further preferably 1 to 3 carbon atoms. When the alkylthiourea contains plural alkyl groups, they may be the same as or different from each other.

When Z used in the first and the second production methods is Se, examples of an Se supply source include: simple substance of selenium; and Se-containing compounds, such as selenourea, selenoacetamide, and alkyl selenol. Further, when Z is Te, examples of a Te supply source include: simple substance of tellurium; and Te-containing compounds, such as diallyl telluride and dimethyl ditelluride.

Examples of the organic solvent used in the first and the second production methods include: amines containing a hydrocarbon group having 4 or more and 20 or less carbon atoms, particularly alkylamines and alkenylamines having 4 or more and 20 or less carbon atoms; thiols containing a hydrocarbon group having 4 or more and 20 carbon atoms or less, particularly alkylthiols and alkenylthiols having 4 or more and 20 or less carbon atoms; and phosphines containing a hydrocarbon group having 4 or more and 20 or less carbon atoms, particularly alkylphosphines and alkenylphosphines having 4 or more and 20 or less carbon atoms. These organic solvents may eventually modify the surfaces of the resulting semiconductor nanoparticles. These organic solvents may be used in combination of two or more thereof and, particularly, a mixed solvent of a combination of at least one selected from thiols containing a hydrocarbon group having 4 or more and 20 or less carbon atoms and at least one selected from amines containing a hydrocarbon group having 4 or more and 20 or less carbon atoms may be used. These organic solvents may also be used as a mixture with other organic solvent. It is noted here that these organic solvents may each be solid at normal temperature as long as they may be dissolved at 120° C. or higher.

In the first production method, a ratio ($M^1/M^2$) of a total number of $M^1$ atoms contained in the first mixture with respect to a total number of $M^2$ atoms may be, for example, 0.1 or more and 2 or less, and it is preferably 0.5 or more and 1.2 or less. Further, a total concentration of $M^1$ in the mixture may be, for example, 1 mmol/L or more and 500 mmol/L or less, and it is preferably 10 mmol/L or more and 50 mmol/L or less.

In the temperature raising performed in the first production method, the temperature of the prepared first mixture may be raised to a range of 120° C. or more and 300° C. or less. The temperature reached by the temperature raising is preferably 125° C. or higher, more preferably 130° C. or higher, still more preferably 135° C. or higher. The temperature reached by the temperature raising is also preferably 175° C. or lower, more preferably 160° C. or lower, still more preferably 150° C. or lower. The temperature raising rate may be, for example, 1° C./min or more and 50° C./min or less, and it is preferably 10° C./min or more and 50° C./min or less.

The atmosphere in which the temperature of the first mixture is raised in the first production method may be an inert gas atmosphere, and it is preferably, for example, an argon atmosphere or a nitrogen atmosphere. By using an inert gas atmosphere, the generation of an oxide as a by-product may be reduced or prevented.

In the addition of the Z supply source in the first production method, the Z supply source is slowly added to the first mixture, whose temperature has been raised to a prescribed temperature, such that the rate of increase in the ratio of the number of Z atoms with respect to a total number of $M^1$ atoms in the mixture is 10/min or lower, while maintaining the prescribed temperature. The rate of increase in the ratio ($Z/M^1$ ratio) of the number of Z atoms with respect to a total number of $M^1$ atoms in the mixture is calculated by, for example, subtracting the $Z/M^1$ ratio measured at a certain time point from the $Z/M^1$ ratio measured after a unit time, and dividing the thus obtained value by the unit time in minutes. The unit time is arbitrarily selected to be, for example, between 1 second and 1 minute. From the standpoint of controlling the growth of nanoparticles, the rate of increase in the ratio of the number of Z atoms with respect to a total number of $M^1$ atoms in the mixture is preferably 0.0001/min or higher and 2/min or lower, more preferably 0.0001/min or higher and 1/min or lower, still more preferably 0.001/min or higher and 0.2/min or lower, particularly preferably 0.001/min or higher and 0.1/min or lower. Further, this rate is preferably 0.0002/min or higher and 2/min or lower, more preferably 0.002/min or higher and 0.2/min or lower, still more preferably 0.0025/min or higher and 0.19/min or lower, particularly preferably 0.04/min or higher and 0.12/min or lower. The rate of increase in the $Z/M^1$ ratio may be, for example, 0.0001/min or higher, and it is preferably 0.001/min or higher, more preferably 0.01/min or higher, particularly preferably 0.04/min or higher. The rate of increase in the $Z/M^1$ ratio may be, for example, 5/min or lower, and it is preferably 2/min or lower, more preferably 0.5/min or lower, or 0.25/min or lower.

A total amount of the Z supply source added in the first production method may be such an amount that the ratio of the number of Z atoms with respect to a total number of $M^1$ atoms in the first mixture is 0.1 or higher and 5 or lower, preferably 1 or higher and 2.5 or lower. The time required for the addition of the Z supply source may be, for example, 1 minute or longer, and it is preferably 5 minutes or longer, more preferably 15 minutes or longer, still more preferably 20 minutes or longer. This required time may also be, for example, 120 minutes or shorter, and it is preferably 60 minutes or shorter, more preferably 40 minutes or shorter.

When the total amount of the Z supply source added in the first production method is such an amount that the ratio of the number of Z atoms with respect to a total number of $M^1$ atoms in the mixture is 0.1 or higher and 2.5 or lower, the rate of increase in the $Z/M^1$ ratio may be, for example, 0.0001/min or higher and 1/min or lower, and it is preferably 0.001/min or higher and 0.2/min or lower, more preferably 0.002/min or higher and 0.2/min or lower, still more preferably 0.0025/min or higher and 0.19/min or lower, particularly preferably 0.04/min or higher and 0.12/min or lower. Further, when the total amount of the Z supply source is such an amount that the ratio of the number of Z atoms with respect to a total number of $M^1$ atoms in the mixture is higher than 2.5 but 5.0 or lower, the rate of increase in the $Z/M^1$ ratio may be, for example, 0.0002/min or higher and 2/min or lower, and it is preferably 0.002/min or higher and 0.2/min or lower, more preferably 0.0025/min or higher and 0.19/min or lower, still more preferably 0.04/min or higher and 0.12/min or lower.

In the first production method, the Z supply source may be added such that the added amount per unit time is substantially the same over the required time. In other words, the added amount per unit time may be a unit amount that is obtained by dividing a total amount of added Z supply source by a number calculated by dividing the required time by the unit time. The unit time may be, for example, 1 second, 5 seconds, 10 seconds, 30 seconds, or 1 minute. The Z supply source may be added continuously or stepwise. Further, the Z supply source may be added to the mixture, for example, in an inert gas atmosphere.

In the first production method, the Z supply source may be added to the mixture in the form of a solution in which a Z-containing compound is dissolved in an organic solvent. When the Z supply source is in the form of a solution of a Z-containing compound, the amount of the Z supply source added per unit time in the addition step may be easily controlled, so that semiconductor nanoparticles having a narrower particle size distribution may be produced efficiently.

Examples of the organic solvent in which a Z-containing compound is dissolved in the first production method include the same ones as those exemplified above for the organic solvent contained in the above-described mixture and, for example, an amine containing a hydrocarbon group having 4 or more and 20 or less carbon atoms may be used.

When the Z supply source used in the first production method is a solution of a Z-containing compound, the concentration of the Z-containing compound may be, for example, 1 mmol/L or higher and 500 mmol/L or lower, and it is preferably 10 mmol/L or higher and 50 mmol/L or lower.

The first production method may further include the heat treatment step of, after the completion of the addition of the Z supply source, performing a heat treatment of the resulting mixture at a temperature in a range of 120° C. or higher and 300° C. or lower. The temperature of this heat treatment may be the same as or different from the temperature to which the temperature of the mixture has been raised. From the standpoint of quantum yield, the temperature of the heat treatment may be, for example, 120° C. or higher and 300° C. or lower, and it is preferably 125° C. or higher and 175° C. or lower, more preferably 130° C. or higher and 160° C. or lower, still more preferably 135° C. or higher and 150° C. or lower.

From the standpoint of the quantum efficiency of the resulting semiconductor nanoparticles, the duration of the heat treatment in the first production method may be, for example, 3 seconds or longer, and it is preferably 5 minutes or longer. An upper limit of the duration of the heat treatment is not particularly limited; however, it may be, for example, 60 minutes or shorter. The duration of the heat treatment is defined that it starts at the time when the temperature reaches a prescribed temperature (e.g., at the time when the temperature reaches 140° C. in a case where the prescribed temperature is 140° C.), and ends at the time when an operation for lowering the temperature is carried out.

The atmosphere of the heat treatment in the first production method may be an inert gas atmosphere, and it is preferably, for example, an argon atmosphere or a nitrogen atmosphere. By using an inert gas atmosphere, the generation of an oxide as a by-product as well as the oxidation of the surfaces of the resulting semiconductor nanoparticles may be reduced or prevented.

The method of producing semiconductor nanoparticles according to the first production method may further include, after the above-described heat treatment, the cooling step of lowering the temperature of a solution containing semiconductor nanoparticles. The cooling step starts at the time when an operation for lowering the temperature is carried out, and ends at the time when the dispersion is cooled to 50° C. or lower.

In the first production method, from the standpoint of inhibiting the generation of $M^1$ and a Z-containing compound from unreacted $M^1$ salt, the cooling step may include a period in which the temperature lowering rate is 50° C./min or higher. For example, the temperature lowering rate may be 50° C./min or higher at the time when the temperature starts to decrease after the operation for lowering the temperature is carried out.

The atmosphere of the cooling step in the first production method is preferably an inert gas atmosphere, such as an argon atmosphere or a nitrogen atmosphere. By using an inert gas atmosphere, not only the generation of an oxide as a by-product but also the oxidation of the surfaces of the resulting semiconductor nanoparticles may be reduced or prevented.

In the second production method, a second mixture that contains an $M^1$-containing salt, an $M^2$-containing salt, a Z supply source, and an organic solvent is prepared. The second mixture in the second production method may be obtained by mixing the $M^1$-containing salt, the $M^2$-containing salt, the Z supply source, and the organic solvent. Alternatively, the second mixture in the second production method may be obtained by preparing a solution that contains the $M^1$-containing salt, the $M^2$-containing salt, and the organic solvent, and adding the Z supply source to the solution in a heated state. When the second mixture is prepared by adding the Z supply source to the solution in a heated state, the heating temperature is for example, 30° C. or higher and 90° C. or lower, preferably 40° C. or higher and 80° C. or lower.

In the second production method, a ratio ($M^1/M^2$) of a total number of $M^1$ atoms contained in the second mixture with respect to a total number of $M^2$ atoms may be, for example, 0.1 or higher and 2 or lower, and it is preferably 0.5 or higher and 1.2 or lower. Further, a total concentration of $M^1$ in the mixture may be, for example, 1 mmol/L or higher and 500 mmol/L or lower, and it is preferably 10 mmol/L or higher and 50 mmol/L or lower.

The heat treatment in the second production method may be a first heat treatment that is performed by raising the temperature of the second mixture to a first temperature and maintaining this temperature for a prescribed time. The first temperature may be, for example, in a range of 200° C. or higher and 370° C. or lower. When the Z supply source contains S, the first temperature is preferably 260° C. or higher and 320° C. or less, more preferably 290° C. or higher and 310° C. or lower. When the Z supply source contains Se, the first temperature is preferably 220° C. or higher, more preferably 250° C. or higher, but preferably 370° C. or lower, more preferably 350° C. or lower. When $M^2$ contains Ga, the first temperature is suitably 230° C. or higher. The duration of maintaining the prescribed temperature may be 1 minute to 180 minutes, and it is preferably 5 minutes to 60 minutes. The heat treatment of the second mixture may also be a second heat treatment that is performed at two or more different temperatures. For example, the second mixture may be heated at a temperature in a range of 30° C. or higher and 190° C. or lower for 1 minute or longer and 30 minutes or shorter, and then heated at the above-described first temperature in a range of 200° C. or higher and 370° C. or lower for 1 minute or longer and 60 minutes or shorter.

The heat treatment in the second production method may also be a third heat treatment that is performed by raising the temperature of the second mixture to a second temperature and maintaining this temperature for a prescribed time. The second temperature may be, for example, in a range of 125° C. or higher and 175° C. or lower, and it is preferably 130° C. or higher and 160° C. or lower, more preferably 135° C. or higher and 150° C. or lower. The temperature raising rate may be, for example, 1° C./min or higher and 50° C./min or lower.

From the standpoint of quantum efficiency, the duration of maintaining the second temperature in the third heat treatment is preferably 3 seconds or longer. An upper limit of the duration of maintaining the second temperature may be, for example, 60 minutes or shorter. As for the duration of maintaining the prescribed temperature, it is defined that the heat treatment starts at the time when the temperature reaches a temperature set in the above-described range, and ends at the time when an operation for lowering the temperature is carried out.

The atmosphere of the first, second, and third heat treatments in the second production method is preferably an inert atmosphere, particularly an argon atmosphere or a nitrogen atmosphere. By using an inert atmosphere, the generation of an oxide as a by-product as well as the oxidation of the surfaces of the resulting semiconductor nanoparticles may be reduced or prevented.

The second production method may further include, after the first, second, and third heat treatments, the cooling step of lowering the temperature of a solution containing semiconductor nanoparticles. The cooling step starts at the time when an operation for lowering the temperature is carried out, and ends at the time when the solution is cooled to 50° C. or lower.

In the second production method, from the standpoint of inhibiting the generation of $M^1$ and a Z-containing compound from unreacted $M^1$ salt, the cooling step may include a period in which the temperature lowering rate is 50° C./min or higher. The temperature lowering rate is preferably 50° C./min or higher particularly at the time when the temperature starts to decrease after the operation for lowering the temperature is carried out.

The atmosphere of the cooling step in the second production method may be an inert atmosphere, and it is particularly preferably an argon atmosphere or a nitrogen atmosphere. By using an inert atmosphere, the generation of an oxide as a by-product as well as the oxidation of the surfaces of the resulting semiconductor nanoparticles may be reduced or prevented.

The first and second production methods of semiconductor nanoparticles serving as cores may also include the separation step of separating the semiconductor nanoparticles from the solution, and may further include the purification step as required. In the separation step, for example, the solution containing the semiconductor nanoparticles may be centrifuged to recover the resulting supernatant containing the semiconductor nanoparticles. In the purification step, for example, an appropriate organic solvent such as an alcohol may be added to the supernatant obtained in the separation step, and the resultant may be subsequently centrifuged to recover the semiconductor nanoparticles as a precipitate. The semiconductor nanoparticles may also be recovered by vaporizing the organic solvent from the supernatant. The thus recovered precipitate may be dried by, for example, vacuum degassing, air drying, or a combination of vacuum degassing and air drying. The air drying may be performed by, for example, leaving the precipitate in the atmosphere at normal temperature and normal pressure and, in this case, the precipitate may be left to stand for 20 hours or longer, for example, about 30 hours. Further, the recovered precipitate may be dispersed in an appropriate organic solvent.

In the first and second production methods of semiconductor nanoparticles serving as cores, the purification step that includes addition of an organic solvent such as an alcohol and centrifugation may be performed multiple times as required. As the alcohol used for purification, a lower alcohol having 1 to 4 carbon atoms, such as methanol, ethanol, or n-propyl alcohol may be used. When the precipitate is dispersed in an organic solvent, for example, a halogen-based solvent such as chloroform, dichloromethane, dichloroethane, trichloroethane, or tetrachloroethane, or a hydrocarbon-based solvent such as toluene, cyclohexane, hexane, pentane, or octane may be used as the organic solvent. From the standpoint of quantum yield, the organic solvent used for dispersing the precipitate may be a halogen-based solvent.

The method of producing core-shell semiconductor nanoparticles may be a production method that includes: the preparation step of obtaining a third mixture by mixing a dispersion containing semiconductor nanoparticles, which is obtained by the above-described first or second production method of semiconductor nanoparticles serving as cores, a compound containing at least one selected from the group consisting of Al, Ga, In, Tl and alkali metals, and at least one simple substance selected from the group consisting of S, O, Se, and Te, or a compound containing the simple substance; and the shell-forming step of heat-treating the third mixture.

In a liquid in which semiconductor nanoparticles are dispersed, light is not scattered; therefore, the dispersion is generally obtained as a transparent (colored or colorless) dispersion. A solvent in which the semiconductor nanoparticles are dispersed may be any organic solvent as in the production of the semiconductor nanoparticles, and the organic solvent may be a surface modifier, or a solution containing a surface modifier. The organic solvent may be, for example: at least one selected from nitrogen-containing compounds containing a hydrocarbon group having 4 or more and 20 or less carbon atoms, which are the surface modifiers described above in relation to the method of producing semiconductor nanoparticles; at least one selected from sulfur-containing compounds containing a hydrocarbon group having 4 or more and 20 or less carbon atoms; or a combination of at least one selected from nitrogen-containing compounds containing a hydrocarbon group having 4 or more and 20 or less carbon atoms and at least one selected from sulfur-containing compounds containing a hydrocarbon group having 4 or more and 20 or less carbon atoms. As the nitrogen-containing compounds, those having a high purity are particularly preferred since such nitrogen-containing compounds are readily available and have a boiling point of higher than 290° C., which is higher than the reaction temperature, and specific examples of the organic solvent include oleylamine, n-tetradecylamine, dodecanethiol, and a combination thereof.

The solvent in which the semiconductor nanoparticles are dispersed may contain a halogen-based solvent such as chloroform, or may be substantially a halogen-based solvent. A dispersion of the semiconductor nanoparticles may be obtained by dispersing the semiconductor nanoparticles in a halogen-based solvent, and subsequently replacing the solvent with an organic solvent containing a surface modifier, such as a nitrogen-containing compound. The replacement of the solvent may be performed by, for example, adding a surface modifier to the dispersion of the semiconductor nanoparticles that contains the halogen-based solvent, and subsequently removing the halogen-based solvent at least partially. Specifically, for example, the dispersion that contains the halogen-based solvent and the surface modifier is heat-treated under reduced pressure to remove the halogen-based solvent at least partially, whereby a dispersion of the semiconductor nanoparticles that contains the surface modifier may be obtained. The reduced pressure condition and the heat-treating temperature in the heat treatment performed under reduced pressure may be set such that the halogen-based solvent is at least partially removed while the surface modifier remains. Specifically, the reduced pressure condition may be, for example, 1 Pa or higher and 2,000 Pa or lower, and it is preferably 50 Pa or higher and 500 Pa or lower. Further, the heat-treating temperature may be, for example, 20° C. or higher and 120° C. or lower, and it is preferably 50° C. or higher and 80° C. or lower.

The dispersion of the semiconductor nanoparticles may be prepared such that the concentration of the particles in the dispersion is, for example, $5.0\times10^{-7}$ mol/L or higher and $5.0\times10^{-5}$ mol/L or lower, particularly $1.0\times10^{-6}$ mol/L or higher and $1.0\times10^{-5}$ mol/L or lower. When the ratio of the particles in the dispersion is excessively low, it is difficult to recover the product by an aggregation and precipitation process using a poor solvent, whereas when the ratio is excessively high, the rate of fusion of the core-forming materials through Ostwald ripening and collision is increased, and this tends to result in a broader particle size distribution.

The compound containing at least one selected from the group consisting of Al, Ga, In, Tl, and alkali metals may be an organic salt, inorganic salt, organic metal compound or the like of these elements. Examples of a compound containing these elements include nitrates, acetates, sulfates, hydrochlorides, sulfonates, and acetylacetonate complexes, among which organic salts such as acetates, and organic metal compounds are preferred. This is because organic salts and organic metal compounds are highly soluble in organic solvents and thus likely to allow reaction to proceed more uniformly.

For example, when S is a constituent element of the shell, a simple substance of sulfur such as high-purity sulfur may be used as the at least one selected from the group consisting of S, O, Se, and Te. Alternatively, a sulfur-containing compound, examples of which include: thiols such as n-butanethiol, isobutanethiol, n-pentanethiol, n-hexanethiol, octanethiol, decanethiol, dodecanethiol, hexadecanethiol, and octadecanethiol; disulfides such as dibenzyl sulfide; thiourea; alkylthioureas such as 1,3-dimethylthiourea; and thiocarbonyl compounds, may be used. Particularly, when an alkylthiourea such as 1,3-dimethylthiourea is used as a Group 16 element source (sulfur source), the shell is sufficiently formed, so that semiconductor nanoparticles exhibiting strong band-edge emission are likely to be obtained. When O is a constituent element of the shell, specifically, an oxygen atom-containing compound, an oxygen atom-containing gas, or the like may be used. Examples of the oxygen atom-containing compound include water and alcohols, and at least one selected from the group consisting of these compounds is preferred. Examples of the oxygen atom-containing gas include oxygen gas and ozone gas, and at least one selected from the group consisting of these gases is preferred. An oxygen source may be added by dissolving or dispersing the oxygen atom-containing compound in a mixture used for shell formation, or by blowing the oxygen atom-containing gas into the mixture used for shell formation.

In the method of producing core-shell semiconductor nanoparticles, shell layers may be formed by a method in which: the temperature of the dispersion containing the semiconductor nanoparticles serving as cores is raised such that a peak temperature thereof is 200° C. or higher and 310° C. or lower; once the temperature of the dispersion reached the peak temperature, a mixed solution, which is prepared in advance by dispersing or dissolving a shell-forming simple substance or compound in an organic solvent, is added to the dispersion in small portions with the peak temperature being maintained; and the temperature is subsequently lowered (slow injection method). In this case, a heat treatment is initiated immediately after the third mixture is obtained as a result of mixing the dispersion containing the semiconductor nanoparticles and the mixed solution. The mixed solution may be added at a rate of 0.1 mL/hr or higher and 10 mL/hr or lower, particularly 1 mL/hr or higher and 5 mL/hr or lower. As required, the peak temperature may be maintained even after the completion of the addition of the mixed solution.

When the peak temperature is equal to or higher than the above-described temperature, because of, for example, sufficient removal of the surface modifier modifying the semiconductor nanoparticles or sufficient progress of the chemical reaction for the shell formation, the formation of semiconductor layers (shells) tends to proceed sufficiently. When the peak temperature is equal to or lower than the above-described temperature, a change in the properties of the semiconductor nanoparticles is inhibited, so that favorable band-edge emission tends to be obtained. The duration of maintaining the peak temperature may be set at a total of 1 minute or longer and 300 minutes or shorter, particularly 10 minutes or longer and 120 minutes or shorter, after the start of the addition of the mixed solution. This retention time of the peak temperature is selected in relation to the peak temperature. The retention time is extended when the peak temperature is lower, while the retention time is shortened when the peak temperature is higher, whereby favorable shell layers are likely to be formed. A temperature raising rate and a temperature lowering rate are not particularly limited, and the temperature may be lowered by, for example, stopping heating with a heat source (e.g., an electric heater) and thereby allowing the resultant to cool after maintaining the peak temperature for a prescribed time.

Alternatively, in the method of producing core-shell semiconductor nanoparticles, semiconductor layers serving as shells may be formed on the surfaces of semiconductor nanoparticles by mixing the dispersion containing the semiconductor nanoparticles serving as cores with a shell-forming simple substance or compound to obtain the third mixture, and subsequently heat-treating the third mixture (heating-up method). Specifically, heating may be performed by slowly raising the temperature of the third mixture such that a peak temperature thereof is 200° C. or higher and 310° C. or lower, maintaining the peak temperature for 1 minute or longer and 300 minutes or shorter, and then slowly lowering the temperature. The temperature raising rate may be, for example, 1° C./min or higher and 50° C./min or lower; however, in order to minimize a change in the properties of the cores caused by continuous heat treatment in the absence of shells, the temperature raising rate is preferably 50° C./min or higher and 100° C./min or lower until the temperature reaches 200° C. In the case of further raising the temperature to beyond 200° C., the subsequent temperature raising rate is preferably set at 1° C./min or higher and 5° C./min or lower. The temperature lowering rate may be, for example, 1° C./min or higher and 50° C./min or lower. The advantages of maintaining the peak temperature in the above-prescribed range are as described above for the slow injection method.

According to the heating-up method, as compared to a case of forming shells by the slow injection method, core-shell semiconductor nanoparticles that exhibit stronger band-edge emission tend to be obtained.

The third mixture in the heating-up method may be prepared by mixing a dispersion of semiconductor nanoparticles that contains a halogen-based solvent, an organic solvent such as a surface modifier, and a shell-forming simple substance or compound, and subsequently removing the halogen-based solvent at least partially by, for example, a heat treatment under reduced pressure. In other words, the preparation step may include: mixing a dispersion of semiconductor nanoparticles that contains a halogen-based solvent, an organic solvent such as a surface modifier, and a shell-forming simple substance or compound to obtain a pre-mixture; and at least partially removing the halogen-based solvent from the pre-mixture to obtain a third mixture.

In either of the above methods, an addition ratio of the shell-forming simple substance or compound may be determined in correspondence to the stoichiometric composition ratio of a semiconductor compound composed of at least one selected from the group consisting of Al, Ga, In, Tl and alkali metals, and at least one selected from the group consisting of S, O, Se, and Te, and the addition ratio does not necessarily have to be the stoichiometric composition ratio. For example, the addition ratio of at least one selected from the group consisting of S, O, Se, and Te with respect to at least one selected from the group consisting of Al, Ga, In, Tl, and alkali metals may be 0.75 to 1.5.

Further, in order to allow shells of a desired thickness to be formed on the semiconductor nanoparticles existing in the dispersion, addition amounts are selected taking into consideration the amount of the semiconductor nanoparticles contained in the dispersion. For example, the addition amounts of the shell-forming simple substance or compound may be determined such that a compound semiconductor having a stoichiometric composition composed of a Group 13 element and a Group 16 element is generated in an amount of 1 μmol or more and 10 mmol or less, particularly 5 μmol or more and 1 mmol or less, with respect to 10 nmol of the semiconductor nanoparticles in terms of the amount of substance as particles. It is noted here that the "amount of substance as particles" refers to a molar amount assuming a single particle as a huge molecule, and is equal to a value obtained by dividing the number of the semiconductor nanoparticles contained in the dispersion by Avogadro constant ($N_A=6.022\times10^{23}$).

In the method of producing core-shell semiconductor nanoparticles, it is preferred to form shells containing indium sulfide or gallium sulfide by using indium acetate or gallium acetylacetonate, and a simple substance of sulfur, thiourea, or dibenzyl disulfide, along with a mixed solution of oleylamine and dodecanethiol, or oleylamine as a dispersion medium.

Further, when a mixed solution of oleylamine and dodecanethiol, or oleylamine is used as a dispersion medium in the heating-up method, core-shell semiconductor nanoparticles giving an emission spectrum, in which the intensity of a broad peak attributed to defect emission is sufficiently lower than the intensity of a band-edge emission peak, tend to be obtained. This tendency is also significantly observed with the use of a gallium source.

Shells are formed in the above-described manner, and core-shell semiconductor nanoparticles having a core-shell structure are formed as a result. The thus obtained core-shell semiconductor nanoparticles having a core-shell structure may be separated from the solvent and, as required, may be further purified and dried. The methods of separation, purification, and drying are as described above in relation to the semiconductor nanoparticles; therefore, detailed description thereof is omitted here.

Mixing Step

In the mixing step of the method of producing a luminescent material, a mixture for the production of a luminescent material is obtained by mixing the core-shell semiconductor nanoparticles with a compound containing at least one of Zn and Ga, a compound containing at least one of S and O, and a solvent. The core-shell semiconductor nanoparticles used in the mixing step may be in the form of a dispersion.

Examples of the compound containing at least one of Zn and Ga include organic acid salts and inorganic acid salts that contain at least one of Zn and Ga. Specifically, examples of the inorganic acid salts include nitrates, sulfates, hydrochlorides, sulfonates, and carbonates, and examples of the organic acid salts include acetates and acetylacetonates. Thereamong, organic acid salts are preferred since they are highly soluble in organic solvents. Examples of an S-containing compound include thioamides such as thioacetamide, in addition to the above-described sulfur-containing compounds. Examples of an O-containing compound include water, alcohols, and amino alcohols.

The solvent is, for example, water, an alcohol having 1 or more and 8 or less carbon atoms, an alkylene glycol having 2 or more and 8 or less carbon atoms, or other polyol such as glycerol. Specific examples of the alcohol include methanol, ethanol, propanol, isopropanol, butanol, isobutanol, hexanol, octanol, and 2-ethylhexanol. The solvent may be a mixed solvent of water and an alcohol; however, it is preferably substantially an alcohol since deterioration of the core-shell semiconductor nanoparticles may thereby be inhibited. The term "substantially" used herein indicates that the content of components other than the alcohol is, for example, 5% by weight or less, preferably 1% by weight or less, more preferably 0.5% by weight or less.

The content of the core-shell semiconductor nanoparticles in the mixture for the production of a luminescent material may be, for example, 10 nmol/L or higher and 10 μmol/L or lower, and it is preferably 100 nmol/L or higher and 1 μmol/L or lower, in terms of concentration based on the amount of substance as nanoparticles (number of particles).

The content of the compound containing at least one of Zn and Ga in the mixture for the production of a luminescent material may be, for example, 1 mmol/L or higher and 1 mol/L or lower, and it is preferably 10 mmol/L or higher and 200 mmol/L or lower. The content of the compound containing at least one of S and O in the mixture for the production of a luminescent material may be, 1 mmol/L or higher and 1 mol/L or lower, and it is preferably 10 mmol/L or higher and 200 mmol/L or lower.

In the mixture for the production of a luminescent material, a molar ratio of the content of the compound containing at least one of S and O with respect to the content of the compound containing at least one of Zn and Ga may be, for example, 0.1 or higher and 10 or lower, preferably 0.5 or higher and 2 or lower.

In the mixing step, the mixture for the production of a luminescent material may be obtained by, for example, adding the compound containing at least one of S and O to a mixture of a solution that contains the compound containing at least one of Zn and Ga and a dispersion of the core-shell semiconductor nanoparticles. Alternatively, the mixture for the production of a luminescent material may be obtained by adding the compound containing at least one of Zn and Ga to a mixture of a solution that contains the compound containing at least one of S and O and a dispersion of the core-shell semiconductor nanoparticles. The temperature of the mixing may be, for example, 0° C. or higher and 100° C. or lower, and it is preferably 10° C. or higher and 80° C. or lower. The atmosphere of the mixing may be, for example, an inert atmosphere and, when an alcohol is used alone as the solvent, the atmosphere is more preferably a dehydrating atmosphere.

The method of producing a luminescent material may also include the surface treatment step of bringing the core-shell semiconductor nanoparticles prepared in the preparation step into contact with the above-described surface modifier (hereinafter, also referred to as “specific surface modifier”), such as an amino alcohol having 2 or more and 20 or less carbon atoms, an ionic surface modifier, a nonionic surface modifier, a nitrogen-containing compound containing a hydrocarbon group having 4 or more and 20 or less carbon atoms, a sulfur-containing compound containing a hydrocarbon group having 4 or more and 20 or less carbon atoms, an oxygen-containing compound containing a hydrocarbon group having 4 or more and 20 or less carbon atoms, or a phosphorus-containing compound containing a hydrocarbon group having 4 or more and 20 or less carbon atoms.

The amino alcohol used in the surface treatment step may be any compound having 2 or more and 20 or less carbon atoms that contains an amino group and an alcoholic hydroxyl group. The number of carbon atoms in the amino alcohol is preferably 3 or more, but preferably 10 or less, more preferably 6 or less. The hydrocarbon group constituting the amino alcohol may be derived from a hydrocarbon such as a linear, branched, or cyclic alkane, alkene, or alkyne. Specific examples of the amino alcohol include amino ethanol, amino propanol, amino butanol, amino pentanol, amino hexanol, and amino octanol. By bringing the core-shell semiconductor nanoparticles into contact with an amino alcohol, the dispersibility of the core-shell semiconductor nanoparticles in the solvent may be further improved, so that a mixture for the production of a luminescent material may be obtained with good dispersion stability. The surface modifier is believed to, for example, adhere to the surfaces of the core-shell semiconductor nanoparticles and thereby further improve the dispersibility in the solvent.

In the surface treatment step, the core-shell semiconductor nanoparticles may be brought into contact with the specific surface modifier by, for example, mixing the core-shell semiconductor nanoparticles and the specific surface modifier. In the surface treatment step, a ratio of the amount of the specific surface modifier with respect to the core-shell semiconductor nanoparticles may be, for example, 0.1 mL or more, and it is preferably 0.5 mL or more and 10 mL or less, with respect to $1\times10^{-8}$ moles of the core-shell semiconductor nanoparticles. The temperature of the contact may be, for example, 0° C. or higher and 100° C. or lower, and it is preferably 10° C. or higher and 80° C. or lower. The duration of the contact may be, for example, 10 seconds or longer and 10 days or shorter, and it is preferably 1 minute or longer and 1 day or shorter. The atmosphere of the contact may be an inert atmosphere, and it is particularly preferably an argon atmosphere or a nitrogen atmosphere.

Luminescent Material Synthesis Step

In the synthesis step, a metal compound which contains at least one of Zn and Ga and at least one of S and O and in which the core-shell semiconductor nanoparticles are embedded is obtained from the mixture for the production of a luminescent material. By a synthesis reaction involving solvolysis (so-called sol-gel method), the metal compound is precipitated from the mixture for the production of a luminescent material, with the core-shell semiconductor nanoparticles being embedded in the metal compound.

In the synthesis step, the metal compound may be precipitated, for example, at room temperature (e.g., 25° C.), or by performing a heat treatment. The temperature of the heat treatment may be, for example, lower than 100° C., and it is preferably 80° C. or lower, more preferably 60° C. or lower. Further, the temperature of the heat treatment may be 0° C. or higher, and it is preferably 30° C. or higher. The time required for the synthesis step may be, for example, 1 minute or longer, and it is preferably 10 minutes or longer. Further, the time required for the synthesis step may be, for example, 10 days or shorter, and it is preferably 3 days or shorter. The atmosphere of the synthesis step is preferably an inert atmosphere, particularly an argon atmosphere or a nitrogen atmosphere. By using an inert atmosphere, a luminescent material having superior emission characteristics may be obtained. When an alcohol is used alone as the solvent, the atmosphere of the synthesis step may be a dehydrating atmosphere as well.

In the synthesis step, the embedding rate of the core-shell semiconductor nanoparticles into the metal compound may be, for example, 10% or higher, and it is preferably 80% or higher. The embedding rate is determined by dividing the amount of the core-shell semiconductor nanoparticles contained in the precipitated metal compound by the amount of the core-shell semiconductor nanoparticles added to the mixture for the production of a luminescent material.

The method of producing a luminescent material may also include the separation step of separating the metal compound generated in the synthesis from the solvent, and may further include the purification step as required. In the separation step, for example, a reaction solution containing a luminescent material may be centrifuged to recover the luminescent material as a precipitate. Alternatively, a precipitate of the luminescent material may be recovered by a solid-liquid separation means such as filtration. In the purification step, for example, the precipitate obtained in the separation step may be washed with an organic solvent such as an alcohol, and the thus washed precipitate may be subjected to a drying treatment.

Light Emitting Device

A light emitting device includes: a light source having an emission peak wavelength in a range of the ultraviolet region to the visible light region; and the above-described luminescent material. The light emitting device includes, for example, a light source having an emission peak wavelength in a range of 380 nm to 485 nm and, as required, may further include other constituent members. By incorporating the above-described luminescent material into the light emitting device, excellent long-term reliability may be achieved. The light emitting device may also include, in addition to the light source and the luminescent material, a member covering the light source.

As the light source, one having an emission peak wavelength in a range of 380 nm to 485 nm, which is a short-wavelength region, is used. The emission peak wavelength of the light source is preferably 420 nm to 485 nm, more preferably 440 nm to 480 nm. This allows efficient excitation of the luminescent material, as well as effective utilization of visible light. In addition, by using the light source of such a wavelength range, a light emitting device having a high emission intensity may be provided.

As the light source, it is preferred to use a semiconductor light emitting element (hereinafter, also simply referred to as "light emitting element"). By using a semiconductor light emitting element as the light source, the light emitting device may be configured to have high efficiency and high output-to-input linearity, and be strong and stable against mechanical impact. The light emitting element may contain a semiconductor layer formed of at least one selected from the group consisting of GaN, GaAs, InGaN, AlInGaP, GaP, SiC, ZnO and the like. A semiconductor light emitting element that emits blue-violet light, blue light, or ultraviolet light preferably contains a nitride compound ($In_XAl_YGa_{1-x-y}N$, wherein 0≤X, 0≤Y, and X+Y≤1) as a semiconductor layer.

The details of the luminescent material included in the light emitting device are as described above. The luminescent material may be, for example, contained in or arranged on the member covering the light source. The luminescent material, when arranged on the light source, is capable of absorbing a portion of the light outputted from the light source, and emitting a longer-wavelength light. In addition, when the light source has an emission peak wavelength in a range of 380 nm to 485 nm, the light outputted from the light source may be effectively utilized. In other words, the loss of the light emitted from the light emitting device may be reduced, so that a highly efficient light emitting device may be provided. The content of the luminescent material in the light emitting device may be selected as appropriate in accordance with the light source, the intended purpose, and the like.

As required, the light emitting device may also include a phosphor in addition to the luminescent material. The phosphor may be any phosphor as long as it absorbs a portion of the light outputted from the light source and converts this light into a light having a wavelength different from the light emitted from the luminescent material. The light emitting device may be configured to contain the phosphor, for example, in the member covering the light source. By incorporating the phosphor, the light emitting device may be provided with various color tones.

Examples of the phosphor include: nitride-based, oxynitride-based, and sialon-based phosphors, which are mainly activated with a lanthanoid element such as Eu or Ce; alkaline earth halogen apatite phosphors, alkaline earth metal borate halogen phosphors, alkaline earth metal aluminate phosphors, alkaline earth silicates, alkaline earth sulfides, alkaline earth thiogallates, alkaline earth silicon nitrides, germanates, and fluoride complexes, which are mainly activated with a lanthanoid element such as Eu, or a transition metal element such as Mn; rare earth aluminates and rare earth silicates, which are mainly activated with a lanthanoid element such as Ce; and inorganic and organic complexes, which are mainly activated with a lanthanoid element such as Eu.

Specific examples of the phosphor include $(Ca,Sr,Ba)_2SiO_4$:Eu, $(Y,Gd)_3(Ga,Al)_5O_{12}$:Ce, $(Si,Al)_6(O,N)_8$:Eu (β-sialon), $SrGa_2S_4$:Eu, $(Ca,Sr)_2Si_5N_8$:Eu, $CaAlSiN_3$:Eu, (Ca, Sr) $AlSiN_3$:Eu, $Lu_3Al_5O_{12}$:Ce, $(Ca,Sr,Ba,Zn)_8MgSi_4O_{16}(F,Cl,Br,I)_2$:Eu, $K_2(Si,Ti,Ge)F_6$:Mn, and $3.5MgO \cdot 0.5MgF_2 \cdot GeO_2$:Mn, and the phosphor preferably contains at least one selected from the group consisting of these substances.

The member covering the light source is configured to contain, for example, at least one kind of a resin. The resin may be either a thermoplastic resin or a thermosetting resin. Specific examples of the thermosetting resin include epoxy resins and silicone resins. The member covering the light source may contain the above-described luminescent material, phosphor, and the like in addition to the resin, and may further contain other components as required. Examples of the other components include: fillers, such as silica, barium titanate, titanium oxide, and aluminum oxide; light stabilizers; and colorants. For example, when a fluorescent member contains a filler as other component, the content thereof may be 0.01% by mass to 20% by mass with respect to the resin.

Examples of the light emitting device according to the present embodiment will now each be described referring to FIGS. 2, 3, and 4.

FIGS. 2, 3, and 4 are schematic cross-sectional views of light emitting devices 10, 20, and 30, respectively, each illustrating an example of a surface-mount light emitting device. The light emitting devices 10, 20, and 30 emit light in the short-wavelength side of visible light (e.g., in a range of 380 nm to 485 nm), and each include: a light emitting element 6 which has an emission peak wavelength in a range of 440 nm to 480 nm; and a molded body 9 in which the light emitting element 6 is arranged. The molded body 9 is obtained by integrally molding a lead 7 and a resin part. The molded body 9 forms a recess having a bottom surface and a side surface, and the light emitting element 6 is arranged on the bottom surface of this recess. The light emitting element 6 has a pair of positive and negative electrodes, which are each electrically connected to the lead 7 via a wire 8. The light emitting element 6 is covered with a resin-containing cover member 4. It is noted here that the cover member 4 not only functions as a member for protecting the light emitting element 6 from the external environment, but also is capable of converting the wavelength of the light emitted from the light emitting element 6.

In the light emitting device 10 illustrated in FIG. 2, a luminescent material 1 containing core-shell semiconductor nanoparticles 2 and a metal compound 3 is enclosed in the cover member 4. In FIG. 2, the luminescent material 1 is mixed at a substantially uniform ratio throughout the cover member 4. By this, a light having a further reduced color unevenness may be obtained. When the luminescent material 1 is enclosed in the cover member 4, the luminescent material 1 may be unevenly distributed in the cover member 4. For example, by arranging the luminescent material 1 close to the light emitting element 6, the wavelength of the light emitted from the light emitting element 6 may be efficiently converted, so that the light emitting device may be configured to have excellent emission efficiency.

In the light emitting device 20 illustrated in FIG. 3, a wavelength conversion member 5, in which the luminescent material 1 containing the core-shell semiconductor nanoparticles 2 and the metal compound 3 is enclosed, is arranged on the surface of the cover member 4. In FIG. 3, the light emitting element 6 and the luminescent material 1 enclosed in the wavelength conversion member 5 are arranged to leave a space therebetween; therefore, the effect of the heat generated from the light emitting element 6 on the luminescent material 1 may be reduced.

In the light emitting device 30 illustrated in FIG. 4, the wavelength conversion member 5, in which the luminescent material 1 containing the core-shell semiconductor nanoparticles 2 and the metal compound 3 is enclosed, is arranged on the upper surface of the cover member 4 and the molded body 9. By this, the same effect as in the light emitting device 20 may be expected in terms of reducing the effect of the heat generated from the light emitting element 6 on the luminescent material 1. In addition, a production cost reducing effect through process simplification and yield improvement simplification may also be expected since the light emitting device 30 may be produced by, for example, a method in which the wavelength conversion member 5 is prepared at once in a separate step and subsequently attached to the constituents of the light emitting device 30 other than the wavelength conversion member 5, or a method in which slurry-form raw materials of the wavelength conversion member 5 are spray-coated and then cured onto the constituents of the light emitting device 30 other than the wavelength conversion member 5.

Examples of the use of the light emitting device include: lighting fixtures; display devices, such as monitors, displays, and radars; and light sources for liquid-crystal display devices.

Examples of the use of the light emitting device include: lighting fixtures; display devices, such as displays and radars; and light sources for liquid-crystal display devices, and the light emitting device is preferably incorporated as a light source in a liquid-crystal display device. Since the band-edge emission by the luminescent material has a short emission lifetime, a light emitting device using this luminescent material is suitable as a light source of a liquid-crystal display device that requires a relatively high response speed. Further, the luminescent material of the present embodiment may exhibit band-edge emission having an emission peak with a small full width at half maximum. Therefore, the light emitting device may take the following mode:

(1) a mode in which blue light having a peak wavelength in a range of 420 nm to 490 nm is provided by a semiconductor blue light emitting element, while green light having a peak wavelength in a range of 510 nm to 550 nm, preferably 530 nm to 540 nm, and red light having a peak wavelength in a range of 600 nm to 680 nm, preferably 630 nm to 650 nm, are provided by the luminescent material; or (2) a mode in which ultraviolet light having a peak wavelength of 400 nm or shorter is provided by a semiconductor light emitting element, while blue light having a peak wavelength in a range of 430 nm to 470 nm, preferably 440 nm to 460 nm, green light having a peak wavelength in a range of 510 nm to 550 nm, preferably 530 nm to 540 nm, and red light having a peak wavelength in a range of 600 nm to 680 nm, preferably 630 nm to 650 nm, are provided by the luminescent material.

By using the light emitting device in either of these modes, a liquid-crystal display device having good color reproducibility may be obtained without the use of a thick color filter. The light emitting device may be used as, for example, a direct backlight or an edge backlight.

Alternatively, a sheet, a plate-like member, or a rod, which contains the luminescent material and is made of a resin or glass, may be incorporated into a liquid-crystal display as a light conversion member independent of the light emitting device.

EXAMPLES

The present invention will now be described more concretely by way of Examples; however, the present invention is not limited to the below-described Examples.

Example 1

Synthesis of Semiconductor Nanoparticles

In a reaction vessel, 0.4 mmol of silver acetate (AgOAc) and 0.4 mmol of indium acetate ($In(OAc)_3$) were mixed with 8 mL of distilled and purified oleylamine (OLA), and dodecanethiol (1.25 mmol, 300 µL) was added thereto to obtain a liquid A. Separately from this, 0.8 mmol of 1,3-dimethylthiourea was dissolved in 2 mL of oleylamine to obtain a liquid B. The liquid A was degassed, purged with an argon atmosphere, and heated to 140° C. Subsequently, the liquid B was added dropwise to the liquid A over a period of 30 minutes. The rate of increase in the ratio of the number of S atoms with respect to the number of Ag atoms in the resulting mixture was 0.067/min. After the completion of the dropwise addition, the liquid temperature was maintained at 140° C. for 30 minutes. The mixture was then allowed to cool to room temperature, and coarse particles were removed by centrifugation, after which methanol was added to the resulting supernatant to induce precipitation of semiconductor nanoparticles serving as cores, which were subsequently recovered by centrifugation. The thus recovered solid was dispersed in 1 mL of chloroform.

Synthesis of Core-Shell Semiconductor Nanoparticles

Gallium acetylacetonate ($Ga(acac)_3$) and 1,3-dimethylthiourea were both measured in an amount of 0.1 mmol and added to 8 mL of distilled and purified oleylamine, and the above-synthesized chloroform dispersion of semiconductor nanoparticles was further added as a dispersion of core particles in an amount equivalent to 30 nmol in terms of nanoparticle concentration. The resulting solution was degassed at about 60° C. and purged with an argon atmosphere, and the temperature of this solution was subsequently rapidly raised to 230° C. (at a temperature raising rate of about 60° C./min). After reaching 230° C., the temperature of the solution was further raised to 280° C. at a rate of 2° C./min, and the solution was heat-treated at 280° C. for 30 minutes. Thereafter, the solution was allowed to cool to room temperature, and methanol was added to induce precipitation of core-shell semiconductor nanoparticles, which were subsequently washed and then dispersed in chloroform.

Synthesis of Luminescent Material

To a solution prepared by partial fractionation of the above-obtained chloroform dispersion of core-shell semiconductor nanoparticles, methanol was added to induce precipitation, and several mL of 4-amino-1-butanol was further added, after which the resultant was stirred at 60° C. for 30 minutes to obtain a liquid C in which the core-shell semiconductor nanoparticles were dispersed.

To 12 mL of 1-propanol containing 0.6 mmol of zinc acetate and 0.5 mL of 4-amino-1-butanol, 0.06 mL of the thus obtained liquid C was added, and 0.6 mmol of thioacetamide was further added with stirring at room temperature. After leaving the resultant to stand with stirring for one day, the resulting precipitate was recovered by centrifugation. This precipitate was washed with methanol and dried in a 70° C. vacuum oven, whereby a luminescent material of Example 1 was obtained. The emission spectrum of the thus obtained luminescent material is shown in FIG. 5. It is noted here that the emission spectrum was measured using a spectrofluorometer (trade name: FP-8600, manufactured by JASCO Corporation) with the excitation light wavelength being set at 450 nm and the observation wavelength being set at 460 nm to 1,010 nm.

Example 2

To 12 mL of 1-propanol containing 0.6 mmol of gallium acetylacetonate ($Ga(acac)_3$) and 0.5 mL of 4-amino-1-butanol, 0.06 mL of the liquid C obtained in Example 1 was added, and 0.6 mmol of thioacetamide was further added with stirring at room temperature. After leaving the resultant to stand with stirring for one day, the resulting precipitate was recovered by centrifugation. This precipitate was washed with methanol and dried in a 70° C. vacuum oven, whereby a luminescent material of Example 2 was obtained. The emission spectrum of the thus obtained luminescent material is shown in FIG. 6.

Comparative Example 1

The chloroform dispersion of core-shell semiconductor nanoparticles that was obtained in Example 1 was used as a luminescent material of Comparative Example 1.

(Evaluation of Durability)

After storing the above-obtained luminescent materials in a dark place in the atmosphere, the emission characteristics of each luminescent material were visually observed.

When the luminescent material of Example 1 was stored at room temperature, the luminescent material maintained its emission after 20 days; however, the emission color changed over time from orange to red. Further, the luminescent material of Example 2 maintained the same yellow emission as its initial emission even after one month of storage at room temperature. On the other hand, the luminescent material of Comparative Example 1 exhibited a reduction in the emission intensity within a few days even in a refrigerated state, and no longer emitted any light after about two weeks.

It was confirmed that the durability was improved in the luminescent materials of Examples 1 and 2 in which core-shell semiconductor nanoparticles were embedded in a metal compound, as compared to the luminescent material of Comparative Example 1 in which core-shell semiconductor nanoparticles were not embedded. It was also confirmed that the durability was further improved in the luminescent material of Example 2 in which core-shell semiconductor nanoparticles were embedded in gallium sulfide, as compared to the luminescent material of Example 1 in which core-shell semiconductor nanoparticles were embedded in zinc sulfide.

The disclosure of Japanese Patent Application No. 2020-040093 (filing date: Mar. 9, 2020) is hereby incorporated by reference in its entirety. All the documents, patent applications, and technical standards that are described in the present specification are hereby incorporated by reference to the same extent as if each individual document, patent application, or technical standard is concretely and individually described to be incorporated by reference.

DESCRIPTION OF SYMBOLS

1: luminescent material
2: core-shell semiconductor nanoparticle
3: metal compound
6: light emitting element
10, 20, 30: light emitting device

The invention claimed is:

1. A luminescent material comprising:

second semiconductor nanoparticles that comprise first semiconductor nanoparticles and a deposit arranged on surfaces of the first semiconductor nanoparticles, and that emit light when irradiated with light; and a metal compound in which the second semiconductor nanoparticles are embedded, wherein the first semiconductor nanoparticles comprise $M^1$, $M^2$, and Z, $M^1$ is at least one selected from the group consisting of Ag, Cu, Au and alkali metals, and comprises at least Ag, $M^2$ is at least one selected from the group consisting of Al, Ga, In and Tl, and comprises at least one of In and Ga, Z comprises at least one selected from the group consisting of S, Se, and Te, the first semiconductor nanoparticles have a composition in which a total content ratio of $M^1$ is 10% by mole or more and 30% by mole or less, a total content ratio of $M^2$ is 15% by mole or more and 35% by mole or less, and a total content ratio of Z is 35% by mole or more and 55% by mole or less, the deposit comprises a semiconductor that is substantially composed of at least one selected from the group consisting of Al, Ga, In, Tl and alkali metals, and at least one selected from the group consisting of S, O, Se and Te, the metal compound comprises at least one of Zn and Ga, and at least one of S and O, and the first semiconductor particles are chalcopyrite-type semiconductor having a tetragonal crystal structure.

2. The luminescent material according to claim 1, wherein the second semiconductor nanoparticles further comprise an amino alcohol in surfaces of the second semiconductor nanoparticles.

3. A luminescent device, comprising:

a light source having an emission peak wavelength in a range of 380 nm to 485 nm; and the luminescent material according to claim 1.

4. A method of producing a luminescent material, the method comprising:

providing second semiconductor nanoparticles that comprise first semiconductor nanoparticles and a deposit arranged on surfaces of the first semiconductor nanoparticles, and that emit light when irradiated with light;

obtaining a mixture that comprises the second semiconductor nanoparticles, a compound containing at least one of Zn and Ga, a compound containing at least one of S and O, and a solvent; and obtaining, from the mixture, a metal compound which comprises at least one of Zn and Ga and at least one of S and O, and in which the second semiconductor nanoparticles are embedded, wherein the first semiconductor nanoparticles comprise $M^1$, $M^2$, and Z, $M^1$ is at least one selected from the group consisting of Ag, Cu, Au and alkali metals, and comprises at least Ag, $M^2$ is at least one selected from the group consisting of Al, Ga, In and Tl, and comprises at least one of In and Ga, Z comprises at least one selected from the group consisting of S, Se, and Te, the first semiconductor nanoparticles have a composition in which a total content ratio of $M^1$ is 10% by mole or more and 30% by mole or less, a total content ratio of $M^2$ is 15% by mole or more and 35% by mole or less, and a total content ratio of Z is 35% by mole or more and 55% by mole or less, and the deposit comprises a semiconductor that is substantially composed of at least one selected from the group consisting of Al, Ga, In, Tl and alkali metals, and at least one selected from the group consisting of S, O, Se and Te, and the first semiconductor particles are chalcopyrite-type semiconductor having a tetragonal crystal structure.

5. The method of producing a luminescent material according to claim 4, the method further comprising bringing the second semiconductor nanoparticles into contact with an amino alcohol.

6. The method of producing a luminescent material according to claim 4, wherein the solvent comprises an alcohol.

7. The method of producing a luminescent material according to claim 4, wherein the metal compound is obtained at a temperature of 0° C. or higher and 100° C. or lower.

8. A luminescent device, comprising:

a light source having an emission peak wavelength in a range of 380 nm to 485 nm; and the luminescent material according to claim 2.

9. The method of producing a luminescent material according to claim 5, wherein the solvent comprises an alcohol.

10. The method of producing a luminescent material according to claim 5, wherein the metal compound is obtained at a temperature of 0° C. or higher and 100° C. or lower.

11. The method of producing a luminescent material according to claim 6, wherein the metal compound is obtained at a temperature of 0° C. or higher and 100° C. or lower.

12. The method of producing a luminescent material according to claim 9, wherein the metal compound is obtained at a temperature of 0° C. or higher and 100° C. or lower.

* * * * *